(12) United States Patent
Sauter et al.

(10) Patent No.: US 12,107,386 B2
(45) Date of Patent: Oct. 1, 2024

(54) ASSEMBLY TECHNIQUES AND COOLING MANIFOLD CONFIGURATION FOR HIGH-POWER LASER SYSTEMS

(71) Applicant: PANASONIC INTELLECTUAL PROPERTY MANAGEMENT CO., LTD, Osaka (JP)

(72) Inventors: Matthew Sauter, Cambridge, MA (US); Bryan Lochman, Nashville, TN (US); Oscar Corripio, Wilmington, MA (US); Bien Chann, Merrimack, NH (US)

(73) Assignee: PANASONIC INTELLECTUAL PROPERTY MANAGEMENT CO. LTD, Osaka (JP)

( * ) Notice: Subject to any disclaimer, the term of this patent is extended or adjusted under 35 U.S.C. 154(b) by 845 days.

(21) Appl. No.: 17/104,485

(22) Filed: Nov. 25, 2020

(65) Prior Publication Data

US 2021/0167575 A1    Jun. 3, 2021

Related U.S. Application Data

(60) Provisional application No. 62/942,768, filed on Dec. 3, 2019, provisional application No. 62/982,832, filed on Feb. 28, 2020.

(51) Int. Cl.
*H01S 5/024* (2006.01)
*H01S 5/02218* (2021.01)
(Continued)

(52) U.S. Cl.
CPC ...... *H01S 5/02423* (2013.01); *H01S 5/02218* (2021.01); *H01S 5/0239* (2021.01); *H01S 5/02438* (2013.01); *H01S 5/146* (2013.01)

(58) Field of Classification Search
CPC ............ H01S 5/02423; H01S 5/02218; H01S 5/0239; H01S 5/02438; H01S 5/146;
(Continued)

(56) References Cited

U.S. PATENT DOCUMENTS 6,970,485 B1 * 11/2005 Kitayama ............... H01S 5/024
257/E23.098
10,243,320 B2 * 3/2019 Kanskar ............. H01S 3/09415
(Continued)

FOREIGN PATENT DOCUMENTS

| CN | 108767631 A | 11/2018 |
|---|---|---|
| JP | 2015130461 A | 7/2015 |
| JP | 2018056498 A | 4/2018 |

OTHER PUBLICATIONS

International Search Report and Written Opinion for International Application No. PCT/US2020/062205, dated Mar. 10, 2021, 11 pages.

*Primary Examiner* — Xinning(Tom) Niu
(74) *Attorney, Agent, or Firm* — Morgan, Lewis & Bockius LLP

(57) ABSTRACT

In various embodiments, laser resonators include enclosed cooling manifolds defining protrusions each configured to conduct heat-exchange fluid to a beam emitter in the resonator. Installation of such cooling manifolds may be facilitated via use of a rigid installation tool functioning as a mechanical reference, prior to installation of the beam emitters and sealing of the beam emitters to the cooling manifold.

29 Claims, 11 Drawing Sheets

(51) Int. Cl.
  *H01S 5/0239*  (2021.01)
  *H01S 5/14*  (2006.01)
(58) Field of Classification Search
  CPC ............. H01S 5/02208; H01S 5/02345; H01S 5/4018; H01S 5/4068; H01S 5/4087; H01S 5/143; H01S 5/4062; H01S 3/0812; H01S 3/0816
  See application file for complete search history.

(56) References Cited

U.S. PATENT DOCUMENTS

| | | | |
|---|---|---|---|
| 2003/0213805 A1* | 11/2003 | Robertson | B01J 19/0073 220/581 |
| 2007/0140758 A1* | 6/2007 | Aze | G03G 15/2064 399/329 |
| 2007/0158668 A1* | 7/2007 | Tarsa | C25D 15/00 257/98 |
| 2007/0291803 A1* | 12/2007 | Crum | H01S 5/02407 372/34 |
| 2014/0160786 A1* | 6/2014 | Hargis | H01S 3/025 362/372 |
| 2017/0093121 A1* | 3/2017 | Huang | C23C 16/45555 |
| 2017/0365978 A1 | 12/2017 | Lochman et al. | |
| 2018/0278013 A1 | 9/2018 | Kanskar et al. | |

* cited by examiner

ASSEMBLY TECHNIQUES AND COOLING MANIFOLD CONFIGURATION FOR HIGH-POWER LASER SYSTEMS

RELATED APPLICATIONS

This application claims the benefit of and priority to U.S. Provisional Patent Application No. 62/942,768, filed Dec. 3, 2019, and U.S. Provisional Patent Application No. 62/982,832, filed Feb. 28, 2020, the entire disclosure of each of which is hereby incorporated herein by reference.

TECHNICAL FIELD

In various embodiments, the present invention relates to laser systems, specifically laser systems with cooling systems utilizing one or more manifolds for containment and direction of cooling fluid.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Laser systems, or "resonators," such as WBC resonators, produce copious amounts of heat during operation and testing, and are therefore typically cooled to increase their longevity. While various systems designs utilize active liquid cooling to draw heat away from resonator components such as the beam emitters, such cooling systems can present various challenges and issues. For example, the housing of the resonator and mounting portions within the resonator should be configured for rigidity and strength to act as a common reference and enable tight alignment for various optical components within the resonator. Deleterious warpage, bending, and distortions of the resonator housing should be avoided during production, testing, and operation of the resonator. However, thermal expansion and contraction may arise from the use of cooling systems, and mechanical stresses on the resonator may result from the interconnection of components of the cooling system to external sources of cooling fluid. Moreover, the alignment tolerances between the cooling system and components such as beam emitters should be accounted for. In view of such issues, there is a need for solutions enabling high-efficiency cooling of laser resonators, and their components (e.g., beam emitters), as well as the installation of such cooling solutions, while preventing mechanical instabilities to ensure optimum optical performance.

SUMMARY

Emitter modules, also referred to as laser source or resonator modules (or simply, "resonators"), in accordance with embodiments of the invention have mechanically strong, rigid housings that act as platforms for various optical components such as beam emitters. In addition, the resonator housing defines a hollow space therewithin to accommodate a cooling manifold (e.g., an enclosed cooling manifold) that receives cooling fluid from an external source, supplies the cooling fluid to various components (e.g., beam emitters), and circulates the cooling fluid back out of the resonator for replenishment. In various embodiments, the cooling manifold is inert to the cooling fluid (e.g., water, such as filtered and/or distilled water, or a glycol) and at least partially flexible in order to isolate mechanical effects (e.g., distortions, bending, etc.) from the resonator housing itself. The cooling manifold may be a discrete enclosed body that may, at least in one or more locations, not be in direct contact with the internal resonator housing itself. The resulting air gap(s) may insulate the cooling manifold from the housing, helping to prevent or reduce thermal gradients arising in the housing and concomitant mechanical effects such as distortion.

Embodiments of the present invention also include installation techniques for the cooling manifold that account for and compensate for any misalignment or loose alignment tolerances between the resonator housing and cooling manifold.

Various embodiments of the invention feature not only the cooling manifold for containing and flowing cooling fluid to the individual beam emitters, but also a feeder manifold that connects the cooling manifold to the external cooling system supplying the cooling fluid. In various embodiments, the feeder manifold is mechanically coupled to the resonator housing, thereby enabling a mechanically stable platform for coupling of external coolant conduits to the resonator. For example, the feeder manifold may be attached to the resonator housing by one or more fasteners (e.g., screws, rivets, bolts, etc.), which may extend through a portion of the feeder manifold (e.g., a flange thereof) into the resonator housing, and/or by brazing or soldering. In this manner, mechanical forces applied to and/or experienced by the feeder manifold may propagate to the resonator housing, or to at least a portion thereof.

In various embodiments, the feeder manifold is mechanically isolated from the cooling manifold so that mechanical forces experienced by the feeder manifold do not propagate within, and create mechanical issues with, the cooling manifold or the optical cavity (or vice versa). For example, the feeder manifold may not be mechanically coupled to the cooling manifold but may simply be sealed thereto via, e.g., one or more seals such as o-rings or gaskets. In this manner, the feeder manifold presents a fixed and rigid interface to end-use customers and the external environment, while the cooling manifold retains mechanical flexibility that enables proper sealing to the cooled optical components. In this manner, the cooling manifold and optical cavity are isolated from external forces, thereby preventing cooling-fluid leakage but also misalignment of the laser system caused by external forces.

O-rings or gaskets, as utilized in embodiments of the present invention, typically include, consist essentially of, or consist of a polymeric or plastic material, e.g., a rubber or a silicone.

In various embodiments, one or more portions of (or even the entirety of) the cooling manifold includes, consists essentially of, or consists of a flexible and/or non-metallic material. For example, in various embodiments the cooling manifold includes, consists essentially of, or consists of an engineering plastic material such as polyetherimide (e.g., ULTEM) or polyetheretherketone (i.e., PEEK). In various embodiments, the plastic material may contain a filler (e.g., in the form of fibers, beads, and/or particles), e.g., glass and/or a ceramic material, in order to enhance tensile strength, stiffness, thermal properties, and overall dimensional stability. Such plastics may also advantageously possess low mechanical creep rates, which beneficially prevent the sealing force utilized for the cooling manifold from relaxing over time and causing leakage in the system. In various embodiments, the cooling manifold may have a low thermal conductivity (e.g., ranging from approximately 0.01 to approximately 50 W/m-K, ranging from approximately 0.05 to approximately 50 W/m-K, or ranging from approximately 0.1 to approximately 50 W/m-K) in order to insulate the lower-temperature cooling fluid from the external environment. The low thermal conductivity of the cooling manifold may also help prevent condensation formation on the exterior of the cooling manifold. Such condensation, whether internal or external to the optical/laser cavity, may cause damage to the resonator or laser system.

Components and/or techniques in accordance with embodiments of the present invention may be utilized to enable the fabrication and operation of resonator modules having two separate cooling loops that may each operate at different temperatures, such as those detailed in U.S. Provisional Patent Application No. 62/942,768, filed on Dec. 3, 2019 ("the '768 provisional application"), the entire disclosure of which is incorporated by reference herein. For example, as detailed in the '768 provisional application, a lower-temperature cooling loop may be utilized to cool beam emitters within the resonator while a higher-temperature cooling loop is utilized to cool other optical components within and/or external to the resonator. In such embodiments, the higher-temperature cooling loop and the lower-temperature cooling loop may be "fluidly isolated" from each other, i.e., may not comingle cooling fluid and may not include conduits that are fluidly connected to each other, at least within the resonator module itself. Outside of the resonator module, the cooling loops may share one or more components and/or conduits, e.g., a larger source of cooling fluid that may be cooled to different temperatures in each of the cooling loops. Such configurations may advantageously reduce or minimize condensation within the laser system. However, embodiments of the invention may also be utilized with resonator modules and laser systems utilizing only a single cooling loop within the resonator and/or multiple cooling loops operated at approximately the same temperature.

In various embodiments featuring multiple cooling loops, the lower-temperature cooling loop may supply a cooling fluid, for cooling the beam emitters, at a temperature ranging from, for example, approximately −25° C. to approximately 25° C., or ranging from approximately 5° C. to approximately 10° C. In various embodiments, the higher-temperature cooling loop may supply a cooling fluid (which may be the same as or different from the cooling fluid supplied by the lower-temperature cooling loop) at a temperature ranging from, for example, approximately 20° C. to approximately 50° C., or ranging from approximately 35° C. to approximately 50° C. In various embodiments, the temperature of the cooling fluid supplied by the lower-temperature cooling loop may have a temperature that is less than the temperature of the cooling fluid supplied by the higher-temperature cooling fluid by at least approximately 10° C., at least approximately 15° C., at least approximately 20° C., at least approximately 25° C., at least approximately 30° C., at least approximately 35° C., at least approximately 40° C., at least approximately 45° C., or at least approximately 50° C.

Resonators in accordance with embodiments of the invention may include one or more components, interfaces, and/or control systems detailed in U.S. patent application Ser. No. 15/660,134, filed on Jul. 26, 2017 (the '134 application), and/or U.S. patent application Ser. No. 16/421,728, filed on May 24, 2019, the entire disclosure of each of which is incorporated by reference herein. For example, resonator modules in accordance with embodiments of the invention may include electrical and optical interfaces that interface with complementary features on a beam-combining enclosure in which the individual beams from the modules are combined into a single output beam (and, in some embodiments, coupled into an optical fiber). The optical and electrical interfaces facilitate the easy replacement of input laser sources with a minimal amount, if any, of source alignment. The emitter modules may be insertable into and mate with input receptacles disposed in or on the enclosure in which the input beams are combined to form the output beam. Resonator modules may connect mechanically, electrically, and/or optically with one of multiple input receptacles disposed in or on (or forming portions of) the enclosure for the beam-combining optics.

As known to those of skill in the art, lasers are generally defined as devices that generate visible or invisible light through stimulated emission of light. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that feature a layer of low bandgap material sandwiched between two high bandgap layers; quantum well lasers that include a very thin middle (quantum well) layer resulting in high efficiency and quantization of the laser's energy; multiple quantum well lasers that include more than one quantum well layer to improve gain characteristics; quantum wire or quantum sea (dots) lasers that replace the middle layer with a wire or dots to produce higher-efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting lasers (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Embodiments of the present invention may couple one or more laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation, unless otherwise indicated.

Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs). Herein, it is understood that references to different "wavelengths" encompass different "ranges of wavelengths," and the wavelength (or color) of a laser corresponds to the primary wavelength thereof; that is, emitters may emit light having a finite band of wavelengths that includes (and may be centered on) the primary wavelength.

Laser systems in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention also process workpieces at one or more spots or along a one-dimensional processing path, rather than simultaneously flooding all or substantially all of the workpiece surface with radiation from the laser beam. In general, processing paths may be curvilinear or linear, and "linear" processing paths may feature one or more directional changes, i.e., linear processing paths may be composed of two or more substantially straight segments that are not necessarily parallel to each other.

Various embodiments of the invention may be utilized with laser systems featuring techniques for varying BPP of their output laser beams, such as those described in U.S. patent application Ser. No. 14/632,283, filed on Feb. 26, 2015, and U.S. patent application Ser. No. 15/188,076, filed on Jun. 21, 2016, the entire disclosure of each of which is incorporated herein by reference.

Laser systems in accordance with various embodiments of the present invention may also include a delivery mechanism that directs the laser output onto the workpiece while causing relative movement between the output and the workpiece. For example, the delivery mechanism may include, consist essentially of, or consist of a laser head for directing and/or focusing the output toward the workpiece. The laser head may itself be movable and/or rotatable relative to the workpiece, and/or the delivery mechanism may include a movable gantry or other platform for the workpiece to enable movement of the workpiece relative to the output, which may be fixed in place.

In various embodiments of the present invention, the laser beams utilized for processing of various workpieces may be delivered to the workpiece via one or more optical fibers (or "delivery fibers"). Embodiments of the invention may incorporate optical fibers having many different internal configurations and geometries. Such optical fibers may have one or more core regions and one or more cladding regions. For example, the optical fiber may include, consist essentially of, or consist of a central core region and an annular core region separated by an inner cladding layer. One or more outer cladding layers may be disposed around the annular core region. Embodiments of the invention may be utilized with and/or incorporate optical fibers having configurations described in U.S. patent application Ser. No. 15/479,745, filed on Apr. 5, 2017, and U.S. patent application Ser. No. 16/675,655, filed on Nov. 6, 2019, the entire disclosure of each of which is incorporated by reference herein.

Structurally, optical fibers in accordance with embodiments of the invention may include one or more layers of high and/or low refractive index beyond (i.e., outside of) an exterior cladding without altering the principles of the present invention. Various ones of these additional layers may also be termed claddings or coatings, and may not guide light. Optical fibers may also include one or more cores in addition to those specifically mentioned. Such variants are within the scope of the present invention. Various embodiments of the invention do not incorporate mode strippers in or on the optical fiber structure. Similarly, the various layers of optical fibers in accordance with embodiments of the invention are continuous along the entire length of the fiber and do not contain holes, photonic-crystal structures, breaks, gaps, or other discontinuities therein.

Optical fibers in accordance with the invention may be multi-mode fibers and therefore support multiple modes therein (e.g., more than three, more than ten, more than 20, more than 50, or more than 100 modes). In addition, optical fibers in accordance with the invention are generally passive fibers, i.e., are not doped with active dopants (e.g., erbium, ytterbium, thulium, neodymium, dysprosium, praseodymium, holmium, or other rare-earth metals) as are typically utilized for pumped fiber lasers and amplifiers. Rather, dopants utilized to select desired refractive indices in various layers of fibers in accordance with the present invention are generally passive dopants that are not excited by laser light, e.g., fluorine, titanium, germanium, and/or boron. Thus, optical fibers, and the various core and cladding layers thereof in accordance with various embodiments of the invention may include, consist essentially of, or consist of glass, such as substantially pure fused silica and/or fused silica, and may be doped with fluorine, titanium, germanium, and/or boron. Obtaining a desired refractive index for a particular layer or region of an optical fiber in accordance with embodiments of the invention may be accomplished (by techniques such as doping) by one of skill in the art without undue experimentation. Relatedly, optical fibers in accordance with embodiments of the invention may not incorporate reflectors or partial reflectors (e.g., grating such as Bragg gratings) therein or thereon. Fibers in accordance with embodiments of the invention are typically not pumped with pump light configured to generate laser light of a different wavelength. Rather, fibers in accordance with embodiments of the invention merely propagate light along their lengths without changing its wavelength. Optical fibers utilized in various embodiments of the invention may feature an optional external polymeric protective coating or sheath disposed around the more fragile glass or fused silica fiber itself.

In addition, systems and techniques in accordance with embodiments of the present invention are typically utilized for materials processing (e.g., cutting, drilling, etc.), rather than for applications such as optical communication or optical data transmission. Thus, laser beams, which may be coupled into fibers in accordance with embodiments of the invention, may have wavelengths different from the 1.3 µm or 1.5 µm utilized for optical communication. In fact, fibers utilized in accordance with embodiments of the present invention may exhibit dispersion at one or more (or even all) wavelengths in the range of approximately 1260 nm to approximately 1675 nm utilized for optical communication.

In an aspect, embodiments of the invention feature a laser resonator that includes, consists essentially of, or consists of a resonator housing, a plurality of base plates, a plurality of beam emitters, and a cooling manifold. The resonator housing defines an interior platform having a top surface and a bottom surface opposite the top surface, and the platform defines a plurality of openings extending therethrough. The base plates are mechanically coupled to the top surface of the platform, and each base plate is disposed over at least a portion of one of the openings extending through the platform. Each beam emitter is disposed over and coupled to one of the base plates. The cooling manifold is coupled beneath the bottom surface of the platform. The cooling manifold defines a plurality of protrusions, and each protrusion extends upward into one of the openings in the platform to thereby define a fluid path extending from the cooling manifold, through the protrusion, and into the base plate disposed thereover.

Embodiments of the invention may include one or more of the following in any of a variety of combinations. One or more seals may be disposed between the cooling manifold and the bottom surface of the platform (e.g., between the protrusions). One or more, or even each, of the seals may include, consist essentially of, or consist of an o-ring or a gasket. The laser resonator may include a plurality of seals each disposed between one of the protrusions and one of the base plates. One or more, or even each, of the seals may include, consist essentially of, or consist of an o-ring or a gasket. The cooling manifold may include, consist essentially of, or consist of a flexible and/or non-metallic material. The flexible material may have a smaller Young's modulus than a material of the resonator housing, a material of the internal platform, and/or a material of the base plates. The cooling manifold may include, consist essentially of, or consist of a plastic or polymeric material. The plastic or polymeric material may contain a non-plastic filler material. The filler material may include, consist essentially of, or consist of glass and/or a ceramic material. The cooling manifold may include, consist essentially of, or consist of polyetherimide and/or polyetheretherketone.

The laser resonator may include a manifold fluid inlet, a manifold fluid outlet, and a feeder manifold. The feeder manifold may extend through and be mechanically coupled to the resonator housing. The feeder manifold may fluidly connect the manifold fluid inlet and manifold fluid outlet with the cooling manifold. One or more seals may be disposed between the feeder manifold and the cooling manifold. Each said seal may include, consist essentially of, or consist of an o-ring or a gasket. The feeder manifold and the cooling manifold may include, consist essentially of, or consist of different materials. The feeder manifold may include, consist essentially of, or consist of the same material as at least a portion of the resonator housing and/or the internal platform. The resonator housing may include, consist essentially of, or consist of a metallic material. The resonator housing may include, consist essentially of, or consist of aluminum and/or stainless steel. The cooling manifold may include, consist essentially of, or consist of a first material. The resonator housing may include, consist essentially of, or consist of a second material. A thermal conductivity of the second material may be greater than a thermal conductivity of the first material.

One or more, or even each, of the beam emitters may include, consist essentially of, or consist of a laser diode or diode bar, and an active cooler disposed beneath the laser diode or diode bar and above one of the base plates. The active cooler may be fluidly connected to the fluid path extending into the base plate therebelow. The active cooler may include, consist essentially of, or consist of an impingement cooler or a microchannel cooler. One or more, or even each, of the openings extending through the platform may be only partially covered by a base plate. One or more, or even each, of the openings extending through the platform may be completely covered by a base plate. One or more, or even each, of the base plates may include, consist essentially of, or consist of a ceramic material. One or more, or even each, of the base plates may include, consist essentially of, or consist of alumina. One or more, or even each, of the base plates may include, consist essentially of, or consist of a first material. The resonator housing (or a portion thereof) may include, consist essentially of, or consist of a second material. A thermal conductivity of the second material may be greater than a thermal conductivity of the first material.

The laser resonator may include, disposed within the resonator housing, a plurality of optical elements configured to receive and/or manipulate beams emitted by the beam emitters. The laser resonator may include, extending into and through the resonator housing, a conduit configured to contain therewithin a cooling fluid for cooling the plurality of optical elements. The conduit may be fluidly isolated from the cooling manifold. The conduit may be connected to a different inlet and outlet than the inlet and outlet of the cooling manifold. The plurality of optical elements may include, consist essentially of, or consist of (i) a dispersive element for combining the beams emitted by the beam emitters into a multi-wavelength beam, and (ii) a partially reflective output coupler for receiving the multi-wavelength beam from the dispersive element, transmitting a first portion of the multi-wavelength beam out of the resonator housing as a resonator output beam, and reflecting a second portion of the multi-wavelength beam back toward the dispersive element (and thence to the beam emitters to stabilize emission wavelengths thereof). The dispersive element and the partially reflective output coupler may be disposed over the bottom surface of the interior platform. The plurality of optical elements may include (i) a plurality of slow-axis collimation lenses disposed optically downstream of the plurality of beam emitters, each slow-axis collimation lens configured to receive one or more beams from one of the beam emitters, and (ii) a plurality of folding mirrors disposed optically downstream of the slow-axis collimation lenses and positioned to receive beams therefrom. The plurality of slow-axis collimation lenses and the plurality of folding mirrors may be disposed over the top surface of the interior platform and/or disposed optically upstream of the dispersive element and the output coupler.

In another aspect, embodiments of the invention feature a laser resonator that includes, consists essentially of, or consists of a resonator housing, a plurality of beam emitters disposed within the resonator housing, a cooling manifold disposed within the resonator housing, a manifold fluid inlet, a manifold fluid outlet, a feeder manifold, and a seal disposed between the feeder manifold and the cooling manifold. Each beam emitter is configured to emit one or more beams. The cooling manifold is configured to cool the beam emitters via flow of a cooling fluid through a conduit within the cooling manifold. The manifold fluid inlet supplies the cooling fluid to the cooling manifold. The manifold fluid outlet receives the cooling fluid from the cooling manifold (i.e., exhausts the cooling fluid from the cooling manifold after it has cooled the beam emitters). The feeder manifold extends through and is mechanically coupled to the resonator housing. The feeder manifold fluidly connects the manifold fluid inlet and manifold fluid outlet with the cooling manifold. The cooling manifold is mechanically coupled to the feeder manifold only via the seal (i.e., the cooling manifold and the feeder manifold are not in direct mechanical contact, and only contact each other through the seal).

Embodiments of the invention may include one or more of the following in any of a variety of combinations. The seal may include, consist essentially of, or consist of an o-ring or a gasket. The feeder manifold and the cooling manifold may include, consist essentially of, or consist of different materials. The feeder manifold may include, consist essentially of, or consist of the same material as at least a portion of the resonator housing and/or the internal platform. The resonator housing may include, consist essentially of, or consist of a metallic material. The resonator housing may include, consist essentially of, or consist of aluminum and/or stainless steel. The cooling manifold may include, consist essentially of, or consist of a first material. The resonator housing may include, consist essentially of, or consist of a second material. A thermal conductivity of the second material may be greater than a thermal conductivity of the first material.

The beam emitters may be disposed within a first cavity (e.g., an optical cavity) defined by the resonator housing. At least a portion of the cooling manifold may be disposed within a second cavity defined by the resonator housing. The first cavity may be separated from the second cavity by an internal platform. The beam emitters may be disposed over a top surface of the internal platform. The second cavity may be disposed over a bottom surface of the internal platform. The laser resonator may include, disposed within the resonator housing, a plurality of optical elements configured to receive and/or manipulate beams emitted by the beam emitters. The laser resonator may include, extending into and through the resonator housing, a conduit configured to contain therewithin a cooling fluid for cooling the plurality of optical elements. The conduit may be fluidly isolated from the cooling manifold. The conduit may be connected to a different inlet and outlet than the inlet and outlet of the cooling manifold. The plurality of optical elements may include, consist essentially of, or consist of (i) a dispersive element for combining the beams emitted by the beam emitters into a multi-wavelength beam, and (ii) a partially reflective output coupler for receiving the multi-wavelength beam from the dispersive element, transmitting a first portion of the multi-wavelength beam out of the resonator housing as a resonator output beam, and reflecting a second portion of the multi-wavelength beam back toward the dispersive element (and thence to the beam emitters to stabilize emission wavelengths thereof). The dispersive element and the partially reflective output coupler may be disposed over the bottom surface of the interior platform. The plurality of optical elements may include (i) a plurality of slow-axis collimation lenses disposed optically downstream of the plurality of beam emitters, each slow-axis collimation lens configured to receive one or more beams from one of the beam emitters, and (ii) a plurality of folding mirrors disposed optically downstream of the slow-axis collimation lenses and positioned to receive beams therefrom. The plurality of slow-axis collimation lenses and the plurality of folding mirrors may be disposed over the top surface of the interior platform and/or disposed optically upstream of the dispersive element and the output coupler.

The cooling manifold may include, consist essentially of, or consist of a flexible and/or non-metallic material. The flexible material may have a smaller Young's modulus than a material of the resonator housing, and/or a material of the internal platform. The cooling manifold may include, consist essentially of, or consist of a plastic or polymeric material. The plastic or polymeric material may contain a non-plastic filler material. The filler material may include, consist essentially of, or consist of glass and/or a ceramic material. The cooling manifold may include, consist essentially of, or consist of polyetherimide and/or polyetheretherketone.

In yet another aspect, embodiments of the invention feature a method of assembling a laser resonator. The laser resonator includes a resonator housing defining an interior platform having a top surface and a bottom surface opposite the top surface, and the platform defines a plurality of openings extending therethrough. An installation tool (e.g., a rigid installation tool) is disposed over the top surface of the platform to cover the openings extending through the platform. A cooling manifold is disposed beneath the bottom surface of the platform. The cooling manifold includes, consists essentially of, or consists of a manifold body and a plurality of protrusions extending therefrom. Each protrusion extends through one of the openings in the platform and contacts the installation tool. The manifold body is mechanically coupled to the bottom surface of the platform. Thereafter, the installation tool is removed. On the top surface of the platform, for each one of the openings in the platform, a beam emitter is sealed over at least a portion of the opening and to the protrusion of the cooling manifold extending into the opening. In this manner, each beam emitter is fluidly connected to one of the protrusions of the cooling manifold.

Embodiments of the invention may include one or more of the following in any of a variety of combinations. The surface of the installation tool facing the platform (e.g., the bottom surface) may be substantially planar. The surface of the installation tool facing away from the platform (e.g., the top surface) may be substantially planar. The surface of the installation tool facing the platform may define a plurality of tool protrusions. Each tool protrusion may protrude into one of the openings in the platform when the installation tool is disposed over the top surface of the platform. Sealing the beam emitter may include, consist essentially of, or consist of (i) providing a seal (e.g., an o-ring or gasket) between the beam emitter and the protrusion of the cooling manifold, and (ii) mechanically coupling the beam emitter to the top surface of the platform. Portions of the manifold body may mechanically deform and/or flex when the manifold body is mechanically coupled to the bottom surface of the platform. One or more seals (e.g., o-rings or gaskets) may be provided between the manifold body and the bottom surface of the platform before the manifold body is mechanically coupled to the bottom surface of the platform.

A feeder manifold may be sealed to the manifold body of the cooling manifold. The feeder manifold may be mechanically coupled to and extend through the resonator housing. Sealing the feeder manifold to the manifold body may include, consist essentially of, or consist of providing a seal (e.g., an o-ring or a gasket) therebetween. The feeder manifold may be fluidly connected to (i) a manifold fluid inlet for supplying the cooling fluid to the cooling manifold, and (ii) a manifold fluid outlet for receiving the cooling fluid from the cooling manifold.

One or more, or even each, of the beam emitters may include, consist essentially of, or consist of (i) a base plate, (ii) a laser diode or diode bar, and (iii) an active cooler disposed beneath the laser diode or diode bar and above the base plate. The active cooler may be fluidly connected to the protrusion of the cooling manifold extending into the opening disposed below the base plate. One or more, or even each, of the active coolers may include, consist essentially of, or consist of an impingement cooler or a microchannel cooler. For one or more, or even each, of the beam emitters, sealing the beam emitter over at least a portion of the opening may include, consist essentially of, or consist of sealing the base plate to the platform such that the base plate only partially covers the opening. For one or more, or even each, of the beam emitters, sealing the beam emitter over at least a portion of the opening may include, consist essentially of, or consist of sealing the base plate to the platform such that the base plate completely covers the opening. One or more, or even each, of the base plates may include, consist essentially of, or consist of a ceramic material. One or more, or even each, of the base plates may include, consist essentially of, or consist of alumina.

A first plurality of optical elements may be disposed or installed over the top surface of the platform. A second plurality of optical elements may be disposed or installed over the bottom surface of the platform (i.e., on the opposite side of the platform from the first plurality of optical elements). The first plurality of optical elements may include, consist essentially of, or consist of (i) a plurality of slow-axis collimation lenses disposed optically downstream of the beam emitters, each slow-axis collimation lens configured to receive one or more beams from one of the beam emitters, and (ii) a plurality of folding mirrors disposed optically downstream of the slow-axis collimation lenses and positioned to receive beams therefrom. The second plurality of optical elements may include, consist essentially of, or consist of (i) a dispersive element for combining the beams emitted by the beam emitters into a multi-wavelength beam, and (ii) a partially reflective output coupler for receiving the multi-wavelength beam from the dispersive element, transmitting a first portion of the multi-wavelength beam out of the resonator housing as a resonator output beam, and reflecting a second portion of the multi-wavelength beam back toward the dispersive element (and thence to the beam emitters to stabilize emission wavelengths thereof).

In another aspect, embodiments of the invention feature a kit for assembling a laser resonator. The laser resonator includes a resonator housing defining an interior platform having a top surface and a bottom surface opposite the top surface. The platform defines a plurality of openings extending therethrough. The kit includes, consists essentially of, or consists of an installation tool (e.g., a rigid installation tool), a cooling manifold, and a plurality of beam emitters. The installation tool is configured for placement over the top surface of the platform to cover the openings extending through the platform. The cooling manifold includes, consists essentially of, or consists of a manifold body and a plurality of protrusions extending therefrom. Each protrusion is configured to extend into or at least partially through one of the openings in the platform. Each beam emitter is configured to be disposed over at least a portion of one of the openings and to be sealed to the protrusion of the cooling manifold extending into said opening.

Embodiments of the invention may include one or more of the following in any of a variety of combinations. The kit may include one or more first seals (e.g., one or more first o-rings or gaskets) each configured to seal one of the beam emitters to the protrusion of the cooling manifold disposed thereunder. The kit may include one or more second seals (e.g., one or more second o-rings or gaskets) each configured to seal the manifold body to the bottom surface of the platform. One or more, or even each, of the beam emitters may include, consist essentially of, or consist of (i) a base plate, (ii) a laser diode or diode bar, and (iii) an active cooler disposed beneath the laser diode or diode bar and above the base plate. The active cooler may be configured for fluid connection to the protrusion of the cooling manifold extending into the opening disposed below the base plate. One or more, or even each, of the active coolers may include, consist essentially of, or consist of an impingement cooler or a microchannel cooler. The kit may include a manifold fluid inlet for supplying cooling fluid to the cooling manifold. The kit may include a manifold fluid outlet for receiving cooling fluid from the cooling manifold. The kit may include a feeder manifold configured to (i) extend through be and mechanically coupled to the resonator housing and (ii) fluidly connect the manifold fluid inlet and manifold fluid outlet with the cooling manifold. The kit may include a third seal (e.g., a third o-ring or gasket) configured to seal the feeder manifold to the cooling manifold.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
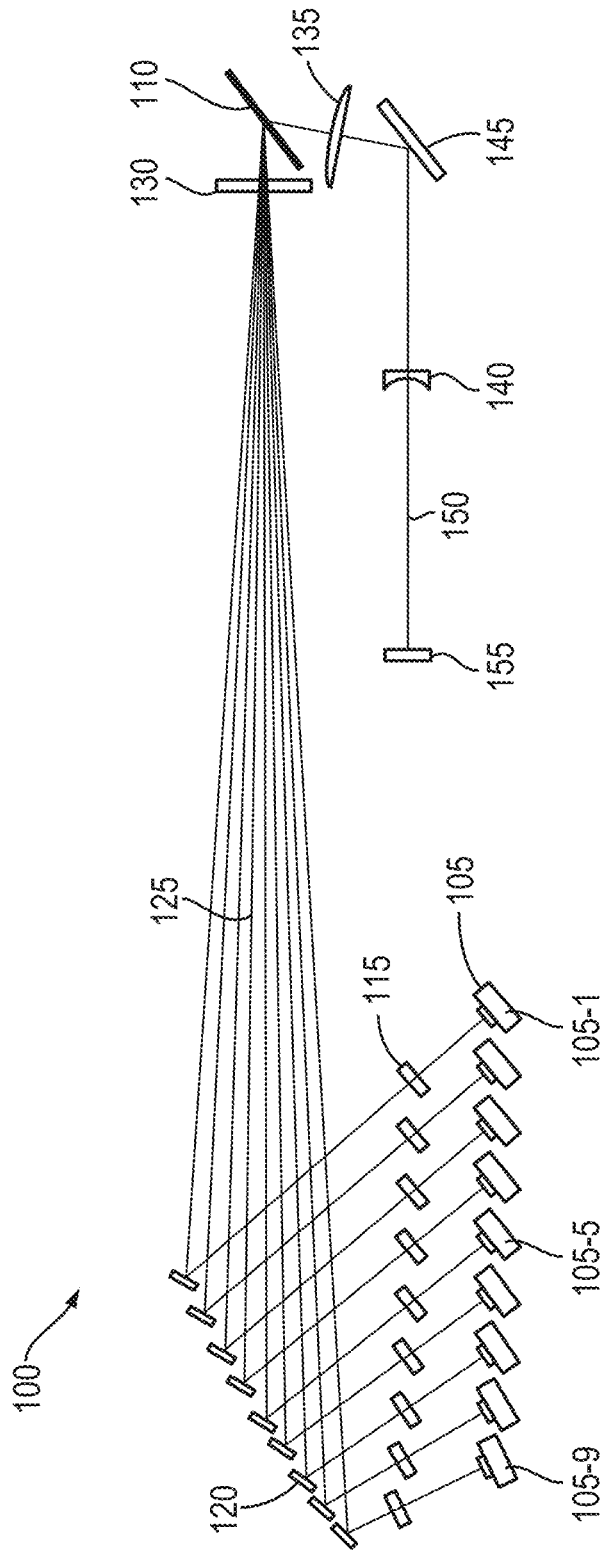
FIG. 1 is a schematic diagram of a laser resonator in accordance with embodiments of the present invention.

The present disclosure will generally utilize WBC resonators as examples of laser systems usable in accordance with embodiments of the present invention. While exemplary embodiments include WBC resonators, embodiments of the invention may also be utilized with other types of laser resonators utilizing one or more beam emitters. FIG. 1 schematically depicts various components of a WBC resonator 100 that may be utilized in embodiments of the present invention. In the depicted embodiment, resonator 100 combines the beams emitted by nine different diode bars (as utilized herein, "diode bar" refers to any multi-beam emitter, i.e., an emitter from which multiple beams are emitted from a single package). Embodiments of the invention may be utilized with fewer or more than nine emitters. In accordance with embodiments of the invention, each emitter may emit a single beam, or, each of the emitters may emit multiple beams. The view of FIG. 1 is along the WBC dimension, i.e., the dimension in which the beams from the bars are combined. The exemplary resonator 100 features nine diode bars 105, and each diode bar 105 includes, consists essentially of, or consists of an array (e.g., one-dimensional array) of emitters along the WBC dimension. In various embodiments, each emitter of a diode bar 105 emits a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 105 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 105 toward a dispersive element 110. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

In embodiments of the invention in which both a FAC lens and an optical twister (e.g., as a microlens assembly) are associated with each of the beam emitters and/or emitted beams, and SAC lenses (as detailed below) affect the beams in the non-WBC dimension. In other embodiments, the emitted beams are not rotated, and FAC lenses may be utilized to alter pointing angles in the non-WBC dimension. Thus, it is understood that references to SAC lenses herein generally refer to lenses having power in the non-WBC dimension, and such lenses may include FAC lenses in various embodiments. Thus, in various embodiments, for example embodiments in which emitted beams are not rotated and/or the fast axes of the beams are in the non-WBC dimension, FAC lenses may be utilized as detailed herein for SAC lenses.

As shown in FIG. 1, resonator 100 also features a set of SAC lenses 115, one SAC lens 115 associated with, and receiving beams from, one of the diode bars 105. Each of the SAC lenses 115 collimates the slow axes of the beams emitted from a single diode bar 105. After collimation in the slow axis by the SAC lenses 115, the beams propagate to a set of interleaving mirrors 120, which redirect the beams 125 toward the dispersive element 110. The arrangement of the interleaving mirrors 120 enables the free space between the diode bars 105 to be reduced or minimized. Upstream of the dispersive element 110 (which may include, consist essentially of, or consist of, for example, a diffraction grating such as the transmissive diffraction grating depicted in FIG. 1, or a reflective diffraction grating), a lens 130 may optionally be utilized to collimate the sub-beams (i.e., emitted rays other than the chief rays) from the diode bars 105. In various embodiments, the lens 130 is disposed at an optical distance away from the diode bars 105 that is substantially equal to the focal length of the lens 130. Note that, in typical embodiments, the overlap of the chief rays at the dispersive element 110 is primarily due to the redirection of the interleaving mirrors 120, rather than the focusing power of the lens 130.

Also depicted in FIG. 1 are lenses 135, 140, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of which is hereby incorporated by reference herein. Resonator 100 may also include one or more optional folding mirrors 145 for redirection of the beams such that the resonator 100 may fit within a smaller physical footprint. The dispersive element 110 combines the beams from the diode bars 105 into a single, multi-wavelength beam 150, which propagates to a partially reflective output coupler 155. The coupler 155 transmits a portion of the beam as the output beam of resonator 100 while reflecting another portion of the beam back to the dispersive element 110 and thence to the diode bars 105 as feedback to stabilize the emission wavelengths of each of the beams.

Figure 2A:
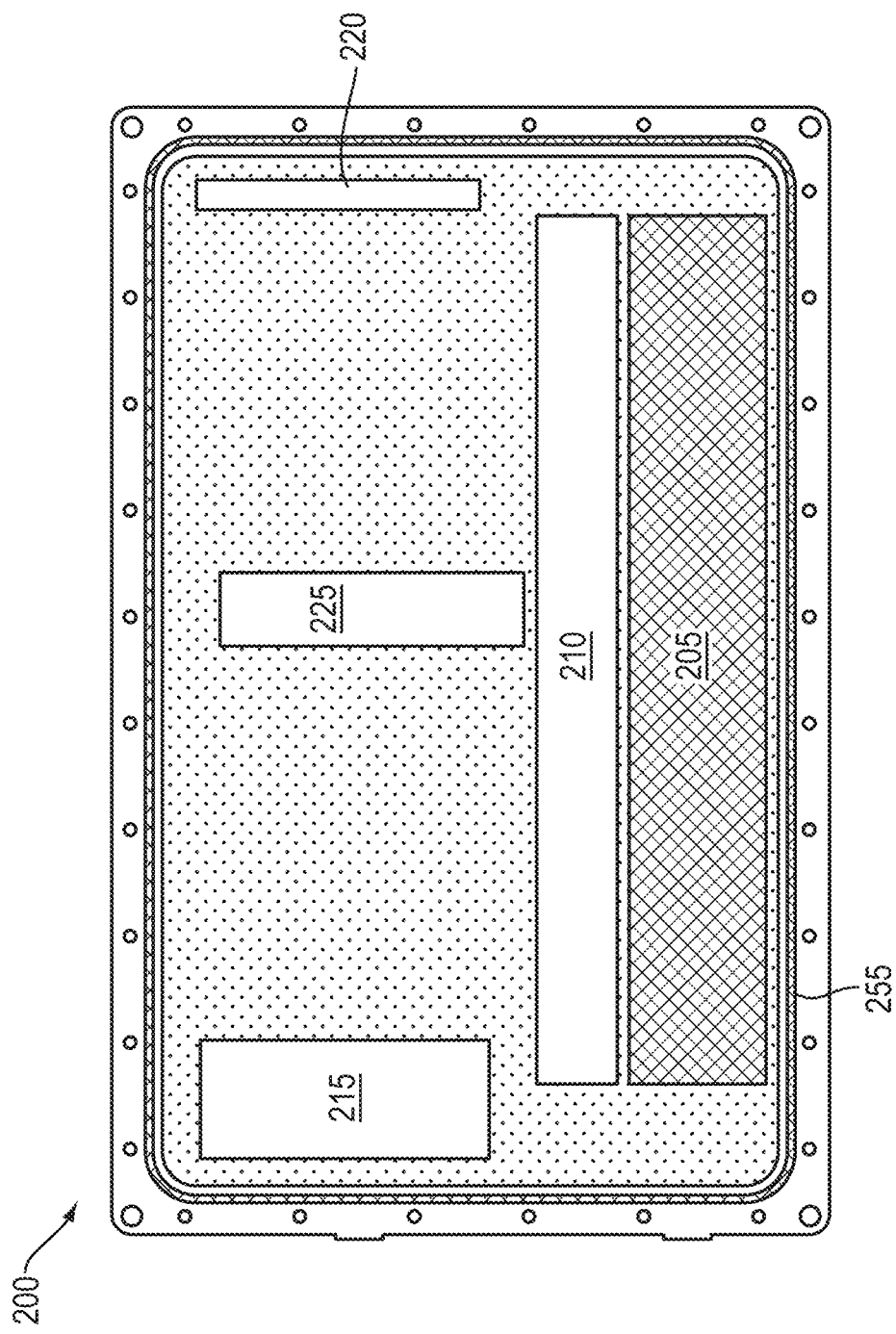
FIG. 2A is a schematic view of a first side of a laser resonator in accordance with various embodiments of the present invention.
Figure 2B:
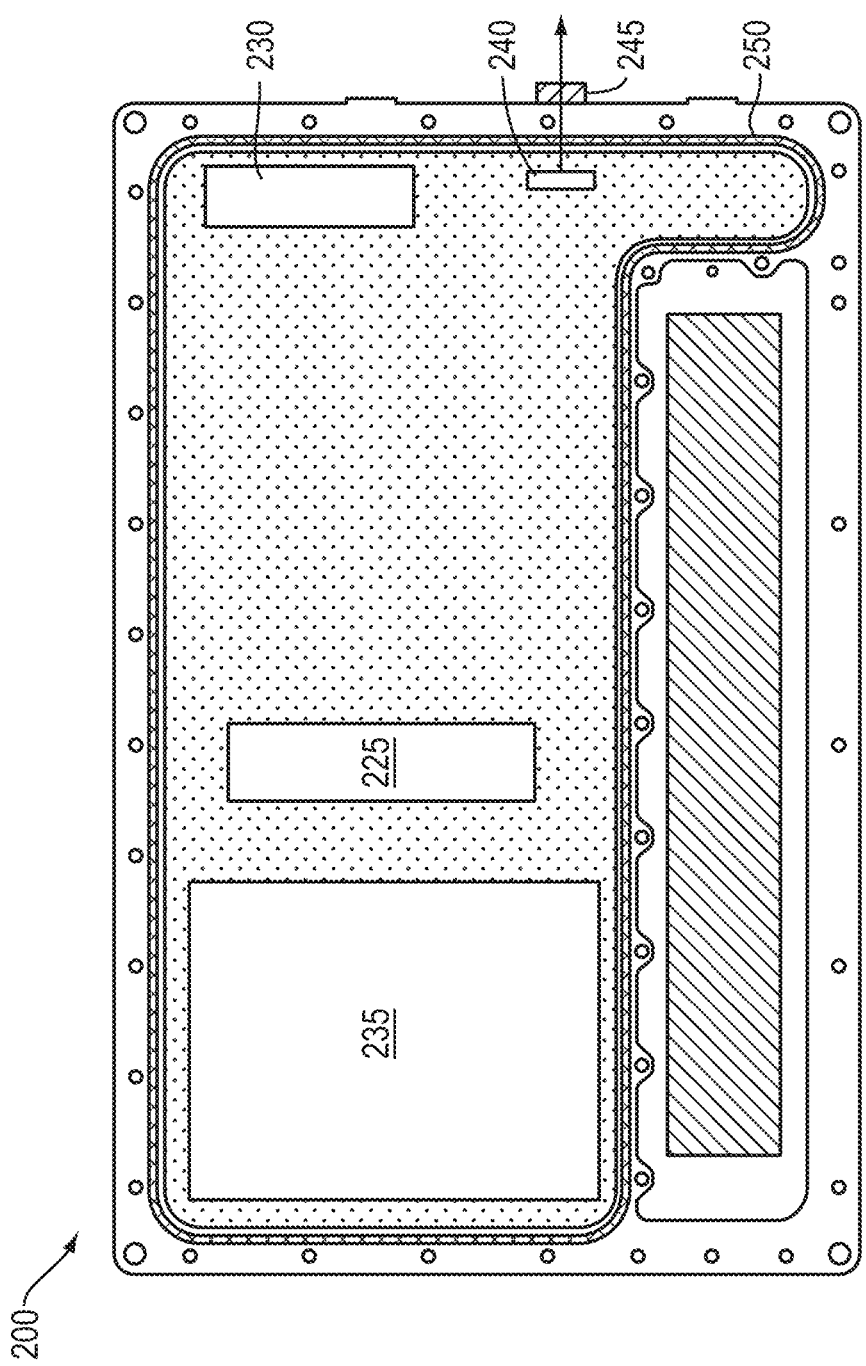
FIG. 2B is a schematic view of a second side of a laser resonator in accordance with various embodiments of the present invention.

Various embodiments of the invention include laser resonators with external lasing cavities, as described in accordance with FIG. 1, and reduce the required size of the resonator by utilizing opposing sides of the resonator to form a larger optical cavity. Reflectors such as mirrors may be utilized to direct the beams within the optical cavity, and, since the optical cavity extends along both sides of the resonator, the overall size of the resonator may be correspondingly reduced for the same cavity size (e.g., compared to a resonator having an optical cavity on only one side). For example, FIGS. 2A and 2B are simplified schematic diagrams of opposite sides of a laser resonator 200 in which areas for various components of the resonator 200 may be mounted. In the exemplary resonator 200, beams from beam emitters mounted in a mounting area 205 may be focused by a group of lenses (and/or other optical elements; e.g., SAC lenses 115) disposed in a lens area 210 toward a group of mirrors (e.g., interleaving mirrors 120) in a mirror area 215. From mirror area 215, the beams from the beam emitters may be directed to another mirror area 220 (containing multiple reflectors such as mirrors, e.g., folding mirrors) and thence through an opening 225 to the opposite side of resonator 200 depicted in FIG. 2B. In FIG. 2B, the beams may be directed to a mirror area 230 (containing multiple reflectors such as mirrors, e.g., folding mirrors), which reflects the beams to a beam-combining area 235. In example embodiments, the beam-combining area 235 may include therewithin a diffusive element such as a diffraction grating (and, in some embodiments, an output coupler), as described in relation to FIG. 1. In various embodiments, the beams each have a different wavelength, and the beams are combined in beam-combining area 235 into an output beam composed of the multiple wavelengths. The beam from the beam-combining area 235 may be directed to a mirror 240 (which, in various embodiments, may be the partially reflective output coupler described in relation to FIG. 1) and thence to an output 245 for emission from the resonator 200. For example, the output 245 may be a window for emission of the beam therethrough or an optical coupler configured to connect to an optical fiber.

FIGS. 2A and 2B also depict sealing paths 250, 255. In various embodiments, cover plates may be mounted over one or both sides of the resonator 200 in order to cover and protect the internal cavities and the components therewithin. For example, the cover plates may be sealed to the resonator 200 via o-rings or other seals, and the cover plates may be attached to the resonator with one or more fasteners (screws, bolts, rivets, etc.) or an adhesive material, and/or via a technique such as welding or brazing.

Figure 3A:
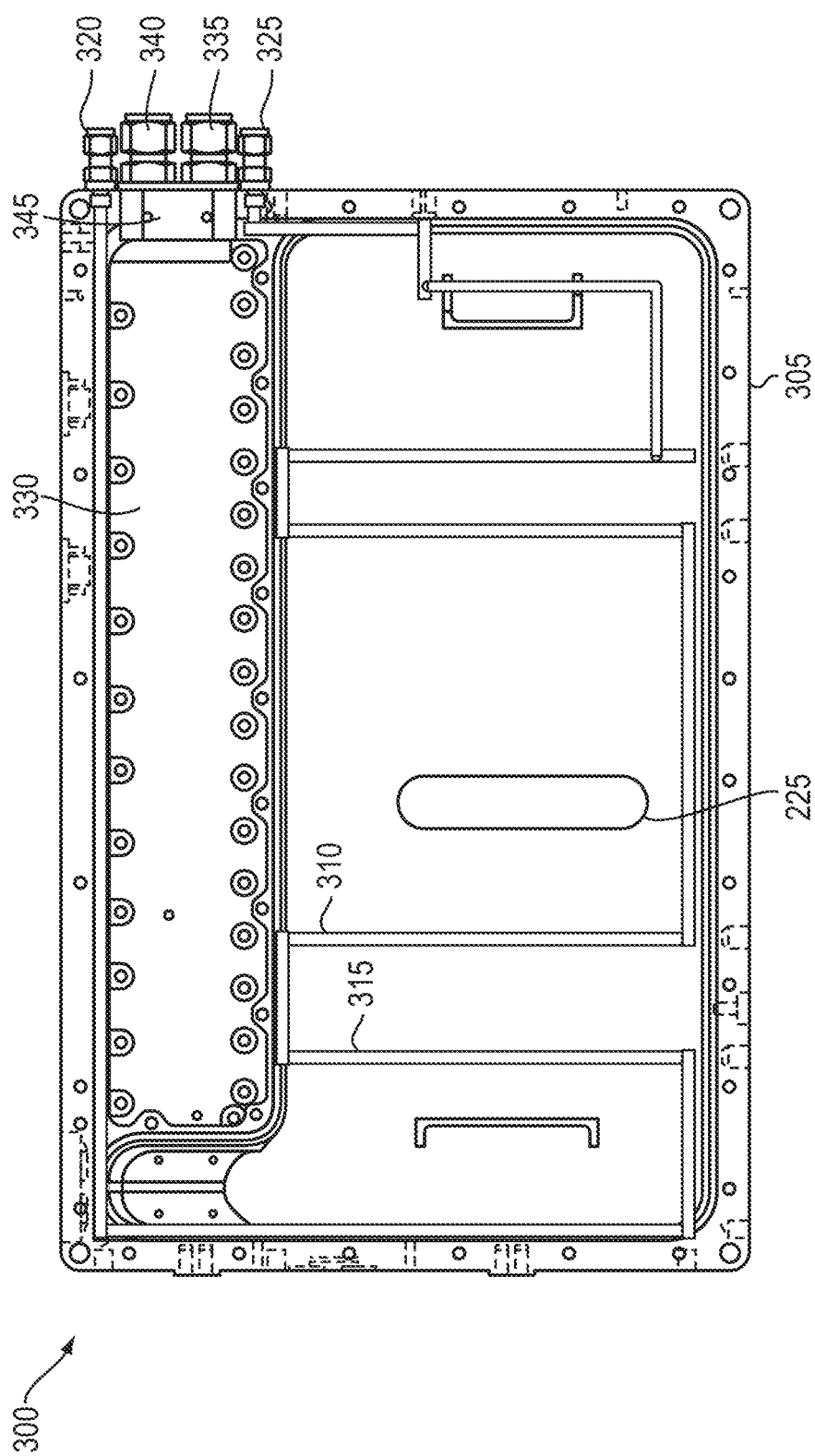
FIG. 3A is a schematic plan view of a laser resonator in accordance with various embodiments of the present invention, showing various internal components.
Figure 3B:
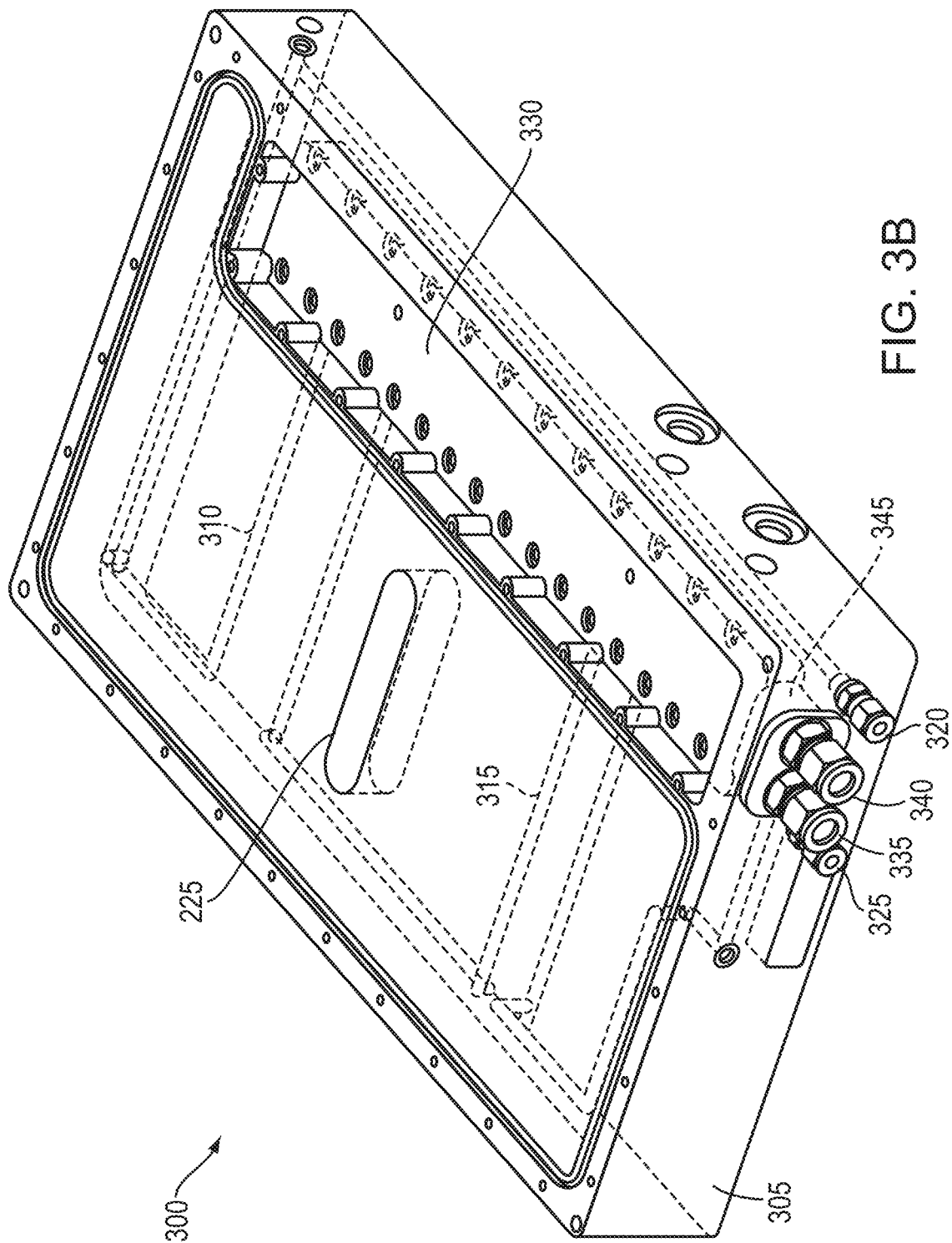
FIG. 3B is a schematic perspective view of a laser resonator in accordance with various embodiments of the present invention, showing various internal components.

FIGS. 3A and 3B schematically depict various internal portions of a laser resonator 300 in accordance with embodiments of the invention. In various embodiments, the resonator 300 may be similar to, and contain similar components as, resonator 200, but embodiments of the invention also include other laser resonators having different configurations. As shown, the resonator 300 features a resonator housing 305 in which one or more beam emitters (typically a plurality of beam emitters), as well as optical components such as one or more of dispersive elements (e.g., diffraction gratings), mirrors, lenses, prisms, etc. are disposed and function to form an output laser beam to be emitted from the housing 305. Various optical and/or mechanical components may therefore be disposed within the housing 305, and resonator 300 may feature a housing cooling loop 310 in order to cool such components. In various embodiments, the housing cooling loop 310 includes, consists essentially of, or consists of a conduit 315 in fluid communication with a housing fluid inlet 320 and a housing fluid outlet 325. During operation of resonator 300, cooling (or "heat-exchange") fluid flows from an external fluid-supply system (which may include, consist essentially of, or consist of, for example, a chiller or other heat exchanger and/or a reservoir of cooling fluid; not shown in FIGS. 3A and 3B) into housing fluid inlet 320, is conducted through the conduit 315 so as to remove heat from various components within the housing 305, and exits through the housing fluid outlet 325. Upon exiting, the fluid may be conducted back to the fluid-supply system for additional cooling before being re-introduced into the conduit 315. As shown, the conduit 315 may have a sinuous and/or branching configuration so as to conduct the cooling fluid into proximity with the various components to be cooled within the housing 305. In various embodiments, as detailed in the '768 provisional application, the conduit 315 does not extend proximate the beam emitters disposed within the housing 305, which are cooled separately. That is, the beam emitters may be cooled utilizing a separate cooling loop (which may, but does not necessarily, operate at a temperature different from that of cooling loop 310). In other embodiments, the beam emitters are also cooled utilizing cooling loop 310. For example, the cooling loop 310 may be fluidly connected to one or more conduits extending proximate the beam emitters, and thus the same cooling fluid may be utilized to cool the beam emitters and various other components within the housing 305.

As shown, also disposed within the housing 305 are a cooling manifold 330, a manifold fluid inlet 335, a manifold fluid outlet 340, and a feeder manifold 345 that fluidly connects the cooling manifold 330 to the manifold fluid inlet 335 and the manifold fluid outlet 340. In various embodiments, as detailed in the '768 provisional application, these components may form at least a portion of a separate cooling loop for the beam emitters disposed within the housing 305, and that cooling loop may operate at a different (e.g., cooler) temperature. In accordance with various embodiments, during operation of resonator 300, cooling fluid flows from an external fluid-supply system (which may include, consist essentially of, or consist of, for example, a chiller or other heat exchanger and/or a reservoir of cooling fluid; not shown in FIGS. 3A and 3B) into manifold fluid inlet 335, is conducted through the cooling manifold 330 so as to remove heat from the beam emitters within the housing 305, and exits through the manifold fluid outlet 340. Upon exiting, the fluid may be conducted back to the fluid-supply system for additional cooling before being re-introduced for further cooling.

In various embodiments of the invention, the cooling manifold 330 occupies (i.e., has an internal volume corresponding to) less than approximately 50%, less than approximately 40%, or less than approximately 30% of the internal volume of the housing 305 of resonator 300. In various embodiments, the cooling manifold 330 occupies at least approximately 10%, at least approximately 20%, or at least approximately 25% of the internal volume of the housing 305 of resonator 300.

In embodiments in which multiple beam emitters are present within the resonator 300, cooling fluid (e.g., water or another heat-exchange fluid such as a glycol) may be conducted to the beam emitters in series or in parallel. In various embodiments, the cooling manifold 330 may be disposed within a cavity formed within the housing 305 separated from other internal components via an internal housing wall. In various embodiments, one or more portions (or even the entirety) of the external surface of the cooling manifold 330 may not be in direct mechanical contact with the housing 305. The resulting air gap(s) act as thermal insulators that prevent or reduce thermal gradients within the housing 305. In this manner, embodiments of the invention reduce or minimize deleterious mechanical effects such as bending or warpage caused by thermal expansion and contraction.

In various embodiments, the feeder manifold 345 extends through at least a portion of the thickness of the housing 305 and may even extend therefrom on one or both sides of the housing wall. That is, the feeder manifold 345 may extend outward beyond the housing wall as well as inward within the housing wall. In embodiments of the invention, in order to provide mechanical stability during external interactions with resonator 300 (e.g., interconnection of cooling-fluid conduits to manifold fluid inlet 335 and manifold fluid outlet 340), the feeder manifold 345 is mechanically coupled to the resonator housing 305 (via, for example, one or more connectors such as rivets or screws, and/or via welding or brazing) while not being mechanically coupled to the cooling manifold 330. Rather, as shown in more detail in subsequent figures, the feeder manifold 345 may be sealed to the cooling manifold 330 via one or more seals (e.g., o-rings, gaskets, etc.). In various embodiments, the resulting seal prevents or reduces the flow of external air, which may contain more humidity, into the housing 305. In addition, the seal between the feeder manifold 345 and the cooling manifold 330, which may allow for flexing or other mechanical relative motion, insulates the cooling manifold 330 from mechanical forces applied to the exterior of the housing 305 (e.g., to the manifold fluid inlet 335 and the manifold fluid outlet 340). In various embodiments, the resonator 300 may also feature an air-exchange or conditioning system (not shown) which removes humidity (and/or, in some embodiments, problematic airborne species such as siloxanes) from the housing 305 by conducting air from the housing 305, through a desiccant and/or other treatment system, and back into the housing 305. Suitable systems are detailed in U.S. patent application Ser. No. 17/071,205, filed Oct. 15, 2020, the entire disclosure of which is incorporated by reference herein.

In various embodiments, one or more portions of (or even the entirety of) the cooling manifold 330 (and/or the feeder manifold 345) includes, consists essentially of, or consists of a flexible and/or non-metallic material. For example, in various embodiments the cooling manifold 330 includes, consists essentially of, or consists of an engineering plastic material such as polyetherimide (e.g., ULTEM) or polyetheretherketone (PEEK). In various embodiments, the plastic material may contain a filler (e.g., in the form of fibers and/or particles), e.g., glass, in order to enhance tensile strength, stiffness, thermal properties, and overall dimensional stability. Such plastics may also advantageously possess low mechanical creep rates, which beneficially prevent the sealing force utilized for the cooling manifold 330 from relaxing over time and causing leakage in the resonator 300.

In various embodiments, the feeder manifold 345 may include, consist essentially of, or consist of one or more materials different from that of the cooling manifold 330, for example to provide mechanical rigidity and stability during mechanical interactions with the manifold fluid inlet 335 and the manifold fluid outlet 340. For example, in various embodiments, the feeder manifold 345 may include, consist essentially of, or consist of a metal such as stainless steel or aluminum. In other examples, the feeder manifold 345 may include, consist essentially of, or consist of an engineering plastic such as polyetherimide or PEEK. In other embodiments, the feeder manifold 345 may include, consist essentially of, or consist of the same material as that of cooling manifold 330.

In various embodiments, the cooling manifold 330 may include, consist essentially of, or consist of a material having a low thermal conductivity (e.g., ranging from approximately 0.01 to approximately 50 W/m-K, ranging from approximately 0.05 to approximately 50 W/m-K, or ranging from approximately 0.1 to approximately 50 W/m-K) in order to insulate the lower-temperature cooling fluid from the external environment and/or from the remaining portions of the housing 305. The low thermal conductivity of the cooling manifold 330 in such embodiments may also help prevent condensation on the exterior of the cooling manifold 330. In contrast, one or more portions of the housing 305 and/or the cooling loop 310 may include, consist essentially of, or consist of a material having a higher thermal conductivity (e.g., aluminum, having a thermal conductivity ranging from approximately 75 to approximately 250 W/m-K).

Figure 4A:
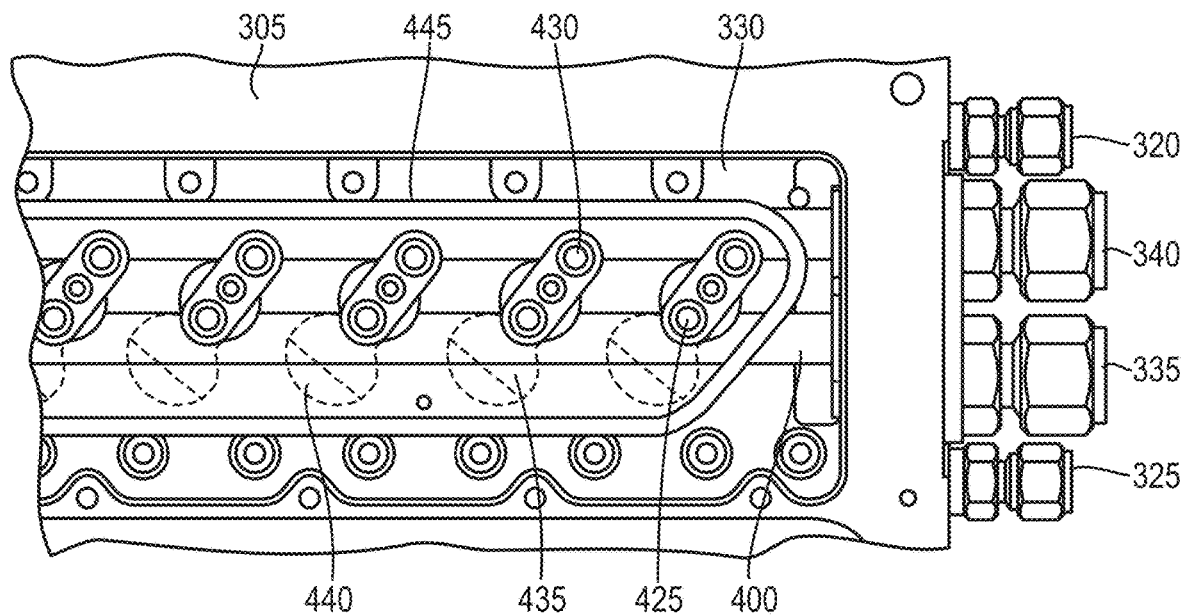
FIG. 4A is a bottom cutaway view of a portion of a laser resonator in accordance with various embodiments of the present invention.
Figure 4B:
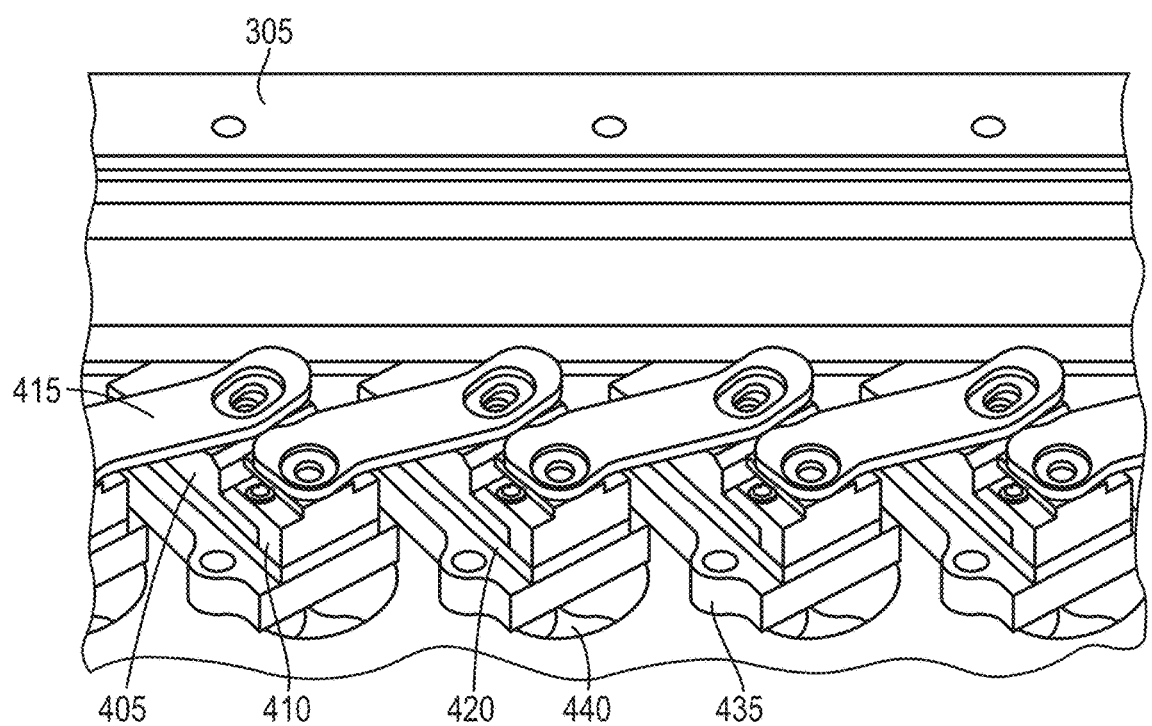
FIG. 4B is a perspective top view of a portion of a laser resonator in accordance with various embodiments of the present invention.

FIG. 4A (bottom cutaway view) and FIG. 4B (perspective top view) depict various components of the resonator 300, with specific focus on the beam emitters and the cooling thereof via the cooling manifold 330. In the illustrated embodiment, cooling fluid flows into the cooling manifold 330 from the manifold fluid inlet 335, through a conduit 400 that is in fluid communication with the individual active coolers for the individual beam emitters, and back to the manifold fluid outlet 340 via the conduit 400. As shown more clearly in FIG. 4B, each beam emitter, e.g., diode bar or diode laser (not easily shown in FIG. 4B) is associated with two electrode contacts 405, 410 that are electrically coupled to the anode and cathode of the beam emitter and that are otherwise electrically isolated from each other. As shown, the beam emitters may be electrically connected in series via electrical connections (e.g., bus bars 415) that electrically connect the electrode contact 405 from one beam emitter to the electrode contact 410 of the neighboring beam emitter.

As shown in the exemplary illustrated embodiment, each beam emitter may also be associated with an active cooler 420, which in various embodiments is integrated into the electrode contact 405. As shown in FIG. 4A, cooling fluid may be conducted upwards to the active cooler 420 via an aperture 425 and, after cooling the beam emitter, back to the conduit 400 via an aperture 430. Within the active cooler 420, the cooling fluid may flow near, and/or impinge on the upper surface of a cavity underlying the beam emitter, and the flow and/or impingement of the cooling fluid cools the beam emitter. Exemplary active coolers and electrode contacts are described in U.S. patent application Ser. No. 15/627,917, filed on Jun. 20, 2017, and U.S. patent application Ser. No. 16/654,339, filed on Oct. 16, 2019, the entire disclosure of each of which is incorporated by reference herein. Other active coolers usable in embodiments of the present invention include microchannel coolers, i.e., multi-layer structures shaped and/or cut so that the layers thereof, when stacked together to form a unified whole, define channels therewithin for the conduction of cooling fluid therein. Exemplary microchannel coolers are depicted and described in U.S. patent application Ser. No. 15/271,773, filed on Sep. 21, 2016, the entire disclosure of each of which is incorporated by reference herein.

As shown in FIG. 4B, the active cooler 420 of each beam emitter may be disposed over or on a base plate 435 that is mechanically coupled to the housing 305. In various embodiments, this mechanical coupling helps to maintain proper alignment of the beam emitters during operation and cooling thereof. In various embodiments, the base plates 435 include, consist essentially of, or consist of a material having a relatively low thermal conductivity (e.g., ranging from approximately 0.5 to approximately 50 W/m-K, ranging from approximately 1 to approximately 50 W/m-K, or ranging from approximately 5 to approximately 50 W/m-K), for example alumina, that acts to thermally isolate the beam emitters. This thermal isolation also, in various embodiments, helps prevent thermal gradients and resulting mechanical distortion in resonator 300, particularly in embodiments in which the housing 305 itself includes, consists essentially of, or consists of a material with higher thermal conductivity (e.g., ranging from approximately 75 to approximately 250 W/m-K) such as aluminum. In various embodiments, each base plate 435 may also be electrically insulating in order to prevent spurious electrical conduction through the housing 305.

As also shown in FIGS. 4A and 4B, the front portion of each base plate 435 may be disposed over, and at least partially thermally insulated from housing 305 by, an opening 440 in resonator housing 305 that forms an air gap below the base plate 435. In other embodiments, the opening 440 is smaller or not present, and the air gap below the base plate 435 is not present. As shown in FIG. 4A, a seal 445 (e.g., an o-ring, gasket, etc.) may be disposed between the cooling manifold 330 and the housing 305 to help prevent ingress of external air into the housing 305.

Figure 5A:
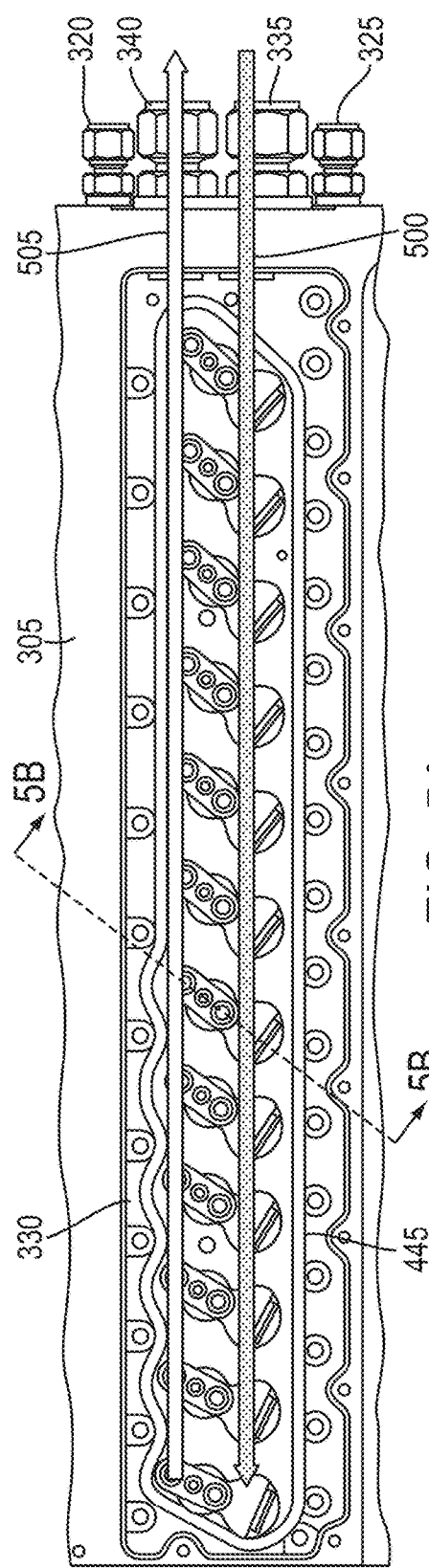
FIG. 5A is a bottom cutaway view of a portion of a laser resonator in accordance with various embodiments of the present invention.
Figure 5B:
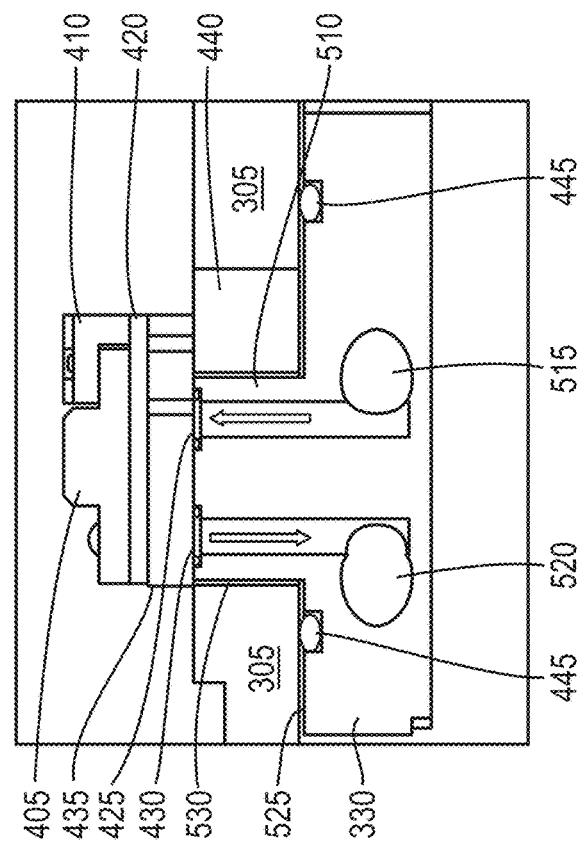
FIG. 5B is a cross-sectional view of the laser-resonator portion of FIG. 5A taken along the line 5B-5B in FIG. 5A.

FIG. 5A is an expanded version of FIG. 4A depicting a cooling loop for the beam emitters in accordance with various embodiments of the invention, with arrows 500, 505 representing the flow of cooling fluid into and out of the cooling manifold 330. FIG. 5B is a cross-sectional view taken along the line 5B-5B in FIG. 5A. As shown, cooling fluid within the cooling manifold 330 flows upward, into a protrusion 510 defined by the cooling manifold 330, via a fluid inlet 515, and back into the conduit 400 via a fluid outlet 520. As described in relation to FIG. 4A, the protrusion 510 of the cooling manifold 330 is sealed to the base plate 435 at apertures 425, 430 via seals such as o-rings or gaskets. And, as also described in relation to FIG. 4B, the air gap (if present) formed by opening 440 in the housing 305, which is disposed beneath the portion of base plate 435 directly underlying the beam emitter itself, provides advantageous thermal isolation. As mentioned above, additional air gaps, for example air gaps 525, 530, may also be disposed between the cooling manifold 330 and the housing 305 for improved thermal isolation. The thermal isolation thereby provided may advantageously reduce or minimize mechanical effects (e.g., bending, warpage, or deformation) due to thermal effects such as differential thermal expansion within the resonator housing 305.

Figure 5C:
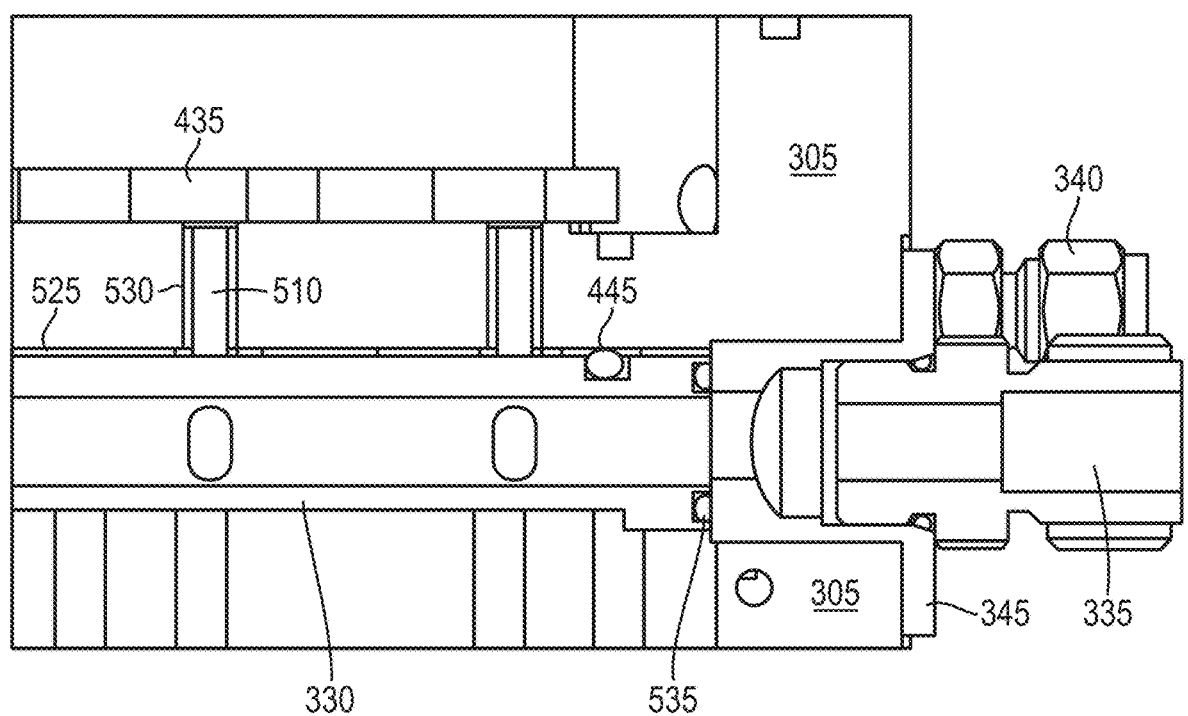
FIG. 5C is a schematic cross-section of a portion of a cooling loop in accordance with various embodiments of the present invention.

FIG. 5C is a schematic cross-section depicting the interface between the cooling manifold 330 and the feeder manifold 345. In various embodiments, the feeder manifold 345 includes, consists essentially of, or consists of any of the materials detailed herein for cooling manifold 330, e.g., a plastic material such as an engineering plastic. In other embodiments, the feeder manifold 345 includes, consists essentially of, or consists of one or more different materials. As mentioned above, the feeder manifold 345 fluidly connects the cooling manifold 330 with the manifold fluid inlet 335 and the manifold fluid outlet 340. While in various embodiments the feeder manifold 345 is mechanically coupled to the resonator housing 305 (via, e.g., one or more connectors such as rivets or screws, or by welding or brazing), the feeder manifold 345 may not be mechanically attached to the cooling manifold 330. As shown in FIG. 5C, the feeder manifold 345 may merely be sealed to the cooling manifold 330 via a seal 535, e.g., an o-ring or gasket, in order to help prevent the exchange of air from within and without the resonator 300. In various embodiments, the feeder manifold 345 may not be otherwise physically connected to the cooling manifold 330. In various embodiments, the provision of feeder manifold 345 as a separate and discrete component, rather than as a portion of cooling manifold 330, improves the mechanical stability of cooling manifold 330 and the delicately aligned beam emitters and associated components. That is, the seal 535 between the feeder manifold 345 and the cooling manifold 330 may isolate the cooling manifold 330 from mechanical forces acting on the feeder manifold 345 (e.g., due to the connection of coolant lines to the inlet 335 and/or outlet 340).

With reference to FIGS. 5A-5C, in various embodiments of the invention, the protrusions 510 of the cooling manifold 330 seal to the beam emitters (e.g., to base plates 435 as shown in FIG. 5B) using one or more seals such as o-rings or gaskets. That is, in various embodiments, the protrusions 510 (or other portions of the cooling manifold 330) do not themselves contact the base plates 435; rather, base plates 435 sit securely on and/or are coupled to the housing 305 and only indirectly contact the protrusions 510 through the one or more seals. Embodiments of the invention utilize configurations and installation techniques that overcome possible loose manufacturing tolerances (and/or lack of planarity) of the housing 305 and/or the cooling manifold 330 in order to form leak-tight seals between the protrusions 510 and the beam emitters, thereby enabling active cooling of the beam emitters while resisting leakage due to mechanically induced or thermally induced deformation of one or more components of the resonator 300.

Figure 6A:
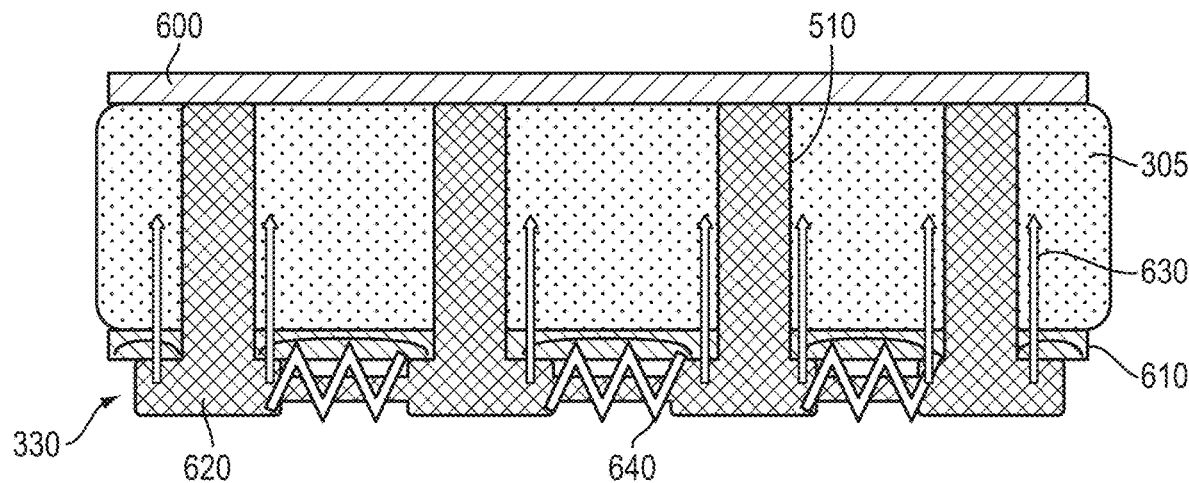
FIG. 6A is a simplified cross-sectional schematic of the first stage of an installation technique for a cooling manifold in accordance with various embodiments of the present invention.

FIG. 6A is a simplified schematic of the first stage of an installation technique in which the individual protrusions 510 of the cooling manifold 330 are positioned at the proper positions to enable efficient sealing of the cooling manifold 330 to the beam emitters without causing yielding or warpage of the resonator housing 305 itself. As shown in FIG. 6A, before the beam emitters are positioned and installed within the resonator housing 305, an installation tool 600 is positioned on the housing 305 above the openings 440 (see FIG. 4A) through which the cooling-related connections to the beam emitters are to be made. While FIG. 6A depicts the installation tool 600 (or at least the surface thereof facing the housing 305) as planar, in various embodiments of the invention, the installation tool 600 may define small protrusions that extend into the openings 440 by a small distance (e.g., approximately 0.1 mm to approximately 1 mm). This small distance may enable proper vertical alignment of the protrusions 510 while accounting for the thickness of the seal (e.g., one or more o-rings or gaskets) between each protrusion 510 and its associated beam emitter. The protrusions defined by the installation tool 600 are configured to fit within the openings 440 but do not necessarily have the same cross-sectional shape as the openings 440 or the top surfaces of the protrusions 510. In various embodiments, the surface of the installation tool 600 facing away from the housing 305 (e.g., the top surface) may be substantially planar, or the surface may also define protrusions extending therefrom; these protrusions may be arranged in the same configuration as, or a different configuration then, any protrusions that extend from the opposite surface of the installation tool 600. In this manner, either surface of the installation tool 600 may be utilized during installation of the cooling manifold (as detailed herein), or the same installation tool 600 may be utilized for the installation of cooling manifolds for two different laser resonators having different internal configurations.

The installation tool 600 may include, consist essentially of, or consist of a rigid material, e.g., a metal or a ceramic material, i.e., a material that does not deform during installation of the cooling manifold 330. In various embodiments, the material of the installation tool 600 has a larger Young's modulus than a material of the cooling manifold 330. In various embodiments, the installation tool 600 includes, consists essentially of, or consists of the same material as at least a portion of the resonator housing 305 (e.g., aluminum and/or stainless steel). In various embodiments, the material of the installation tool 600 has a larger Young's modulus than a material of the resonator housing 305.

During installation of the cooling manifold 330, the installation tool 600 is placed over and in contact with the top of the housing 305 where the beam emitters will subsequently be installed. As also shown in FIGS. 5B and 5C, the cooling manifold 330 is positioned below the housing 305 (opposite the installation tool 600) such that the protrusions 510 of the cooling manifold 330 extend upward into openings defined in the housing 305. One or more seals 610 (e.g., o-rings and/or gaskets) are positioned between a body portion 620 of the cooling manifold 330 (i.e., the portion of the cooling manifold between the protrusions 510). The individual protrusions 510 abut against the installation tool 600 (or protrusions defined thereby) to position the protrusions 510 at the proper heights for subsequent sealing against the beam emitters. The body portion 620 of the cooling manifold 330 is mechanically coupled to the housing 305 via, e.g., fasteners such as screws or rivets, resulting in mechanical force (shown as arrows 630) applied against the seals 610, which act as springs. During installation of the cooling manifold 330, the protrusions 510 press against the installation tool 600 and are therefore positioned at the proper heights—since the cooling manifold 330 is composed of a material with some mechanical flexibility, the body portion 620 may deform or bend (schematically depicted as springs 640) when being fastened to the housing 305 to enable this proper positioning of protrusions 510. Once the cooling manifold 330 is coupled to the housing 305, the installation tool 600 is removed, and the beam emitters may be installed over the protrusions 510 (e.g., with one or more seals such as o-rings or gaskets therebetween). The seal(s) 610 provides an opposing spring force, which allows the cooling manifold 330 to remain mechanically stable after removal of the installation tool 600. In this manner, the cooling manifold 330 is force balanced to allow its various sealing surfaces to be tightly controlled and ready for proper leak-tight sealing.

Figure 6B:
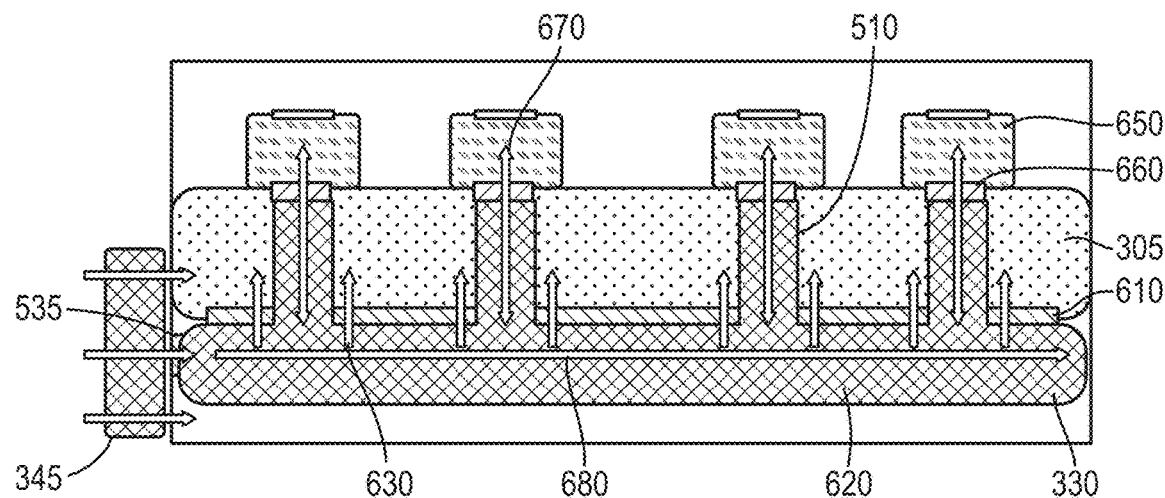
FIG. 6B is a simplified cross-sectional schematic of a portion of a laser resonator after installation of a cooling manifold and beam emitters in accordance with various embodiments of the present invention.
Figure 6C:
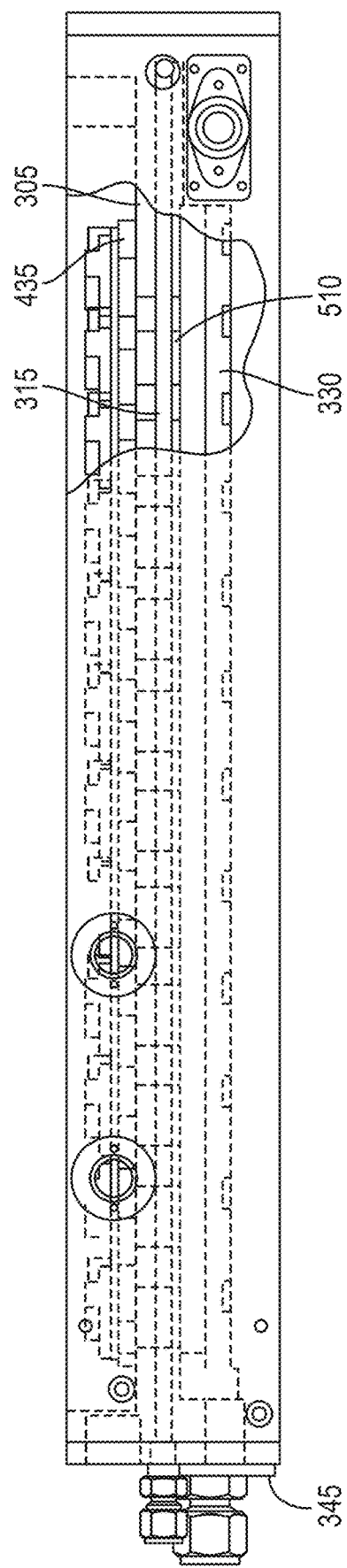
FIG. 6C is a transparent side view of a laser resonator after installation of beam emitters and a cooling manifold in accordance with various embodiments of the present invention.

FIG. 6B is a simplified schematic showing the cooling manifold 330 in position after removal of the installation tool 600 and installation of the beam emitters 650 and the feeder manifold 345. As shown, one or more seals 660 (e.g., o-rings or gaskets) may be positioned between each protrusion 510 of the cooling manifold 330 and its associated beam emitter 650 for sealing of the cooling-fluid pathway. And, the installation technique utilizing the installation tool 600 enables proper positioning of each protrusion 510 that compensates for any non-planarity or other loose mechanical tolerances of the housing 305. As shown in more detail in FIGS. 5A and 5B, the cooling fluid may move along pathways 670, 680 to cool the individual beam emitters 650. As shown in more detail in FIG. 5C, the feeder manifold 345 is attached to the housing 305 (rather than to any of the components therein, including cooling manifold 330), while the seal 535 enables a leak-tight fluid path between the feeder manifold 345 and the cooling manifold 330 while mechanically isolating the cooling manifold 330 from mechanical forces applied to the feeder manifold 345 or other external portions of the housing 305. FIG. 6C is a more detailed side view of resonator 300 after installation of the beam emitters over the various protrusions 510 of the cooling manifold 330.

Figure 7:
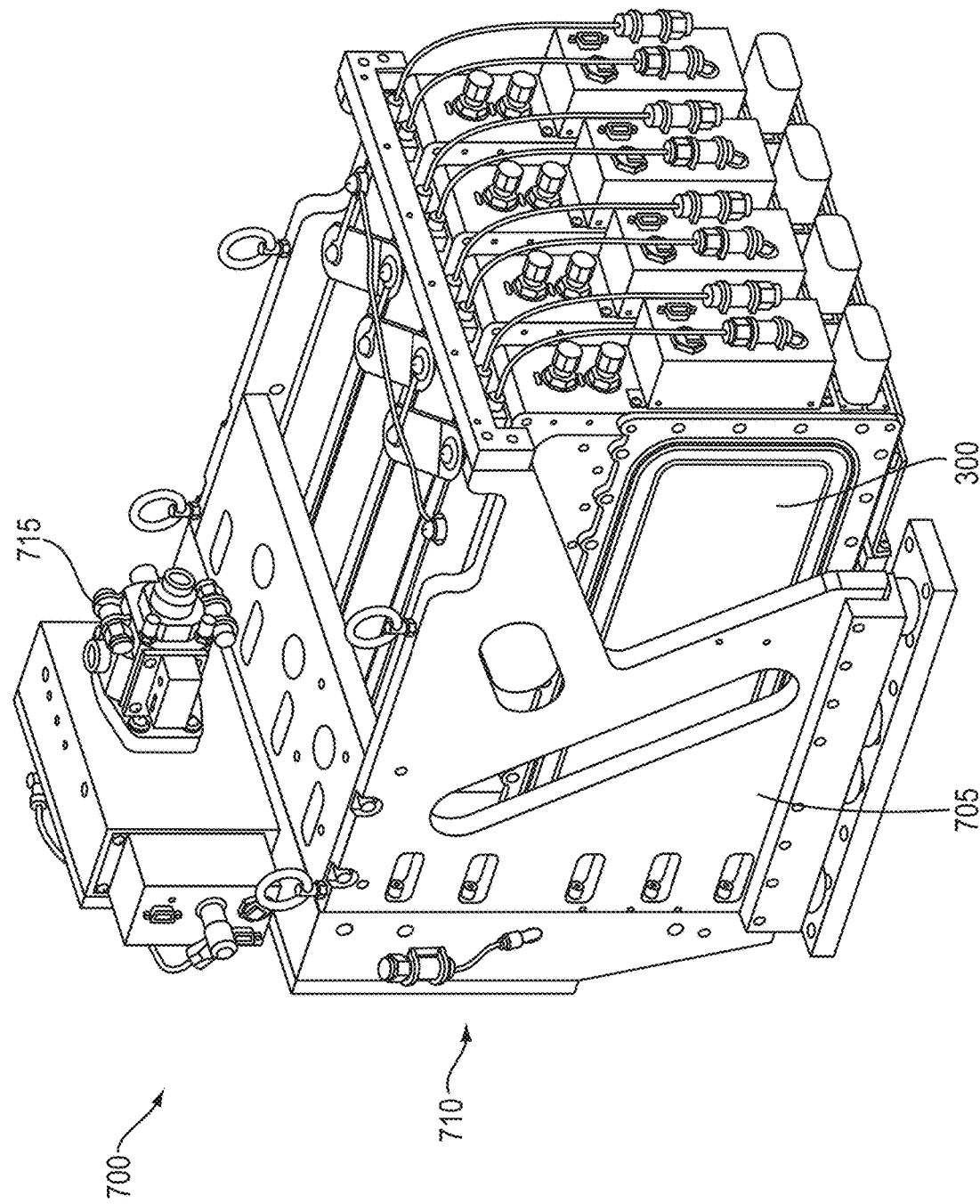
FIG. 7 is a perspective view of a laser engine incorporating multiple laser resonators in accordance with various embodiments of the present invention.

In various embodiments of the invention, a laser system incorporates multiple resonators 300, and the output beams from the resonators 300 are combined downstream (e.g., within a master housing and/or by one or more optical elements) into a single output beam that may be directed to a workpiece for processing (e.g., welding, cutting, annealing, etc.) and/or coupled into an optical fiber. For example, FIG. 7 depicts an exemplary laser system (or "laser engine") 700 in accordance with embodiments of the invention. In laser system 700, multiple laser resonators 300 are mounted within a master housing 705, and the output beams from the resonators 300 are emitted into a beam-combining module 710 thence to a fiber optic module 715. In exemplary embodiments, beam-combining module 710 may contain one or more optical elements, such as mirrors, dichroic mirrors, lenses, prisms, dispersive elements, polarization beam combiners, etc., that may combine beams received from the various resonators into one or more output beams. In various embodiments, the fiber-optic module 715 may contain, for example, one or more optical elements for adjusting output laser beams, as well as interface hardware connecting to one or more optical fibers for coupling of the beams into the optical fiber(s). While laser engine 700 is depicted as including four resonators 300, laser engines in accordance with embodiments of the invention may include one, two, three, or five or more laser resonators.

In various embodiments of the invention, the cooling fluid utilized to cool the beam emitters and/or other optical elements in the resonator 300 may be shared (e.g., in parallel or in series) with other resonators in a laser engine and/or with other components of the laser engine such as the beam-combining module and/or fiber optic module. For example, in various embodiments, the cooling fluid utilized to cool the beam emitters and/or other optical elements in the resonator 300 may be utilized to cool an optical fiber (e.g., a delivery fiber) attached to the fiber optic module and/or a processing head attached to the optical fiber (not shown in FIG. 7). For example, the cooling fluid may also be directed into and/or through a cooling jacket disposed around at least a portion of the delivery fiber, and/or the processing head. Exemplary processing heads may include, within an enclosure, one or more optical elements (e.g., lenses and/or mirrors) for manipulating the beam received from the fiber optic module, via the optical fiber, and focusing the beam onto a workpiece for processing.

As mentioned herein, in various embodiments of the present invention, the output beams of the laser systems or laser resonators may be propagated, e.g., via a fiber optic module, to a delivery optical fiber (which may be coupled to a laser delivery head) and/or utilized to process a workpiece. In various embodiments, a laser head contains one or more optical elements utilized to focus the output beam onto a workpiece for processing thereof. For example, laser heads in accordance with embodiments of the invention may include one or more collimators (i.e., collimating lenses) and/or focusing optics (e.g., one or more focusing lenses). A laser head may not include a collimator if the beam(s) entering the laser head are already collimated. Laser heads in accordance with various embodiments may also include one or more protective window, a focus-adjustment mechanism (manual or automatic, e.g., one or more dials and/or switches and/or selection buttons). Laser heads may also include one or more monitoring systems for, e.g., laser power, target material temperature and/or reflectivity, plasma spectrum, etc. A laser head may also include optical elements for beam shaping and/or adjustment of beam quality (e.g., variable BPP) and may also include control systems for polarization of the beam and/or the trajectory of the focusing spot. In various embodiments, the laser head may include one or more optical elements (e.g., lenses) and a lens manipulation system for selection and/or positioning thereof for, e.g., alteration of beam shape and/or BPP of the output beam, as detailed in U.S. patent application Ser. No. 15/188,076, filed on Jun. 21, 2016, the entire disclosure of which is incorporated by reference herein. Exemplary processes include cutting, piercing, welding, brazing, annealing, etc. The output beam may be translated relative to the workpiece (e.g., via translation of the beam and/or the workpiece) to traverse a processing path on or across at least a portion of the workpiece.

In embodiments utilizing an optical delivery fiber, the optical fiber may have many different internal configurations and geometries. For example, the optical fiber may include, consist essentially of, or consist of a central core region and an annular core region separated by an inner cladding layer. One or more outer cladding layers may be disposed around the annular core region. Embodiments of the invention may incorporate optical fibers having configurations described in U.S. patent application Ser. No. 15/479,745, filed on Apr. 5, 2017, and U.S. patent application Ser. No. 16/675,655, filed on Nov. 6, 2019, the entire disclosure of each of which is incorporated by reference herein.

In various embodiments, a controller may control the motion of the laser head or output beam relative to the workpiece via control of, e.g., one or more actuators. The controller may also operate a conventional positioning system configured to cause relative movement between the output laser beam and the workpiece being processed. For example, the positioning system may be any controllable optical, mechanical or opto-mechanical system for directing the beam through a processing path along a two- or three-dimensional workpiece. During processing, the controller may operate the positioning system and the laser system so that the laser beam traverses a processing path along the workpiece. The processing path may be provided by a user and stored in an onboard or remote memory, which may also store parameters relating to the type of processing (cutting, welding, etc.) and the beam parameters necessary to carry out that processing. The stored values may include, for example, beam wavelengths, beam shapes, beam polarizations, etc., suitable for various processes of the material (e.g., piercing, cutting, welding, etc.), the type of processing, and/or the geometry of the processing path.

As is well understood in the plotting and scanning art, the requisite relative motion between the output beam and the workpiece may be produced by optical deflection of the beam using a movable mirror, physical movement of the laser using a gantry, lead-screw or other arrangement, and/or a mechanical arrangement for moving the workpiece rather than (or in addition to) the beam. The controller may, in some embodiments, receive feedback regarding the position and/or processing efficacy of the beam relative to the workpiece from a feedback unit, which will be connected to suitable monitoring sensors.

The controller may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680×0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam to optimize the processing (e.g., cutting, piercing, or welding) of the workpiece, e.g., in accordance with records in the database corresponding to the type of material being processed.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:
1. A laser resonator comprising:
a resonator housing defining an interior platform having a top surface and a bottom surface opposite the top surface, the platform defining a plurality of openings extending therethrough;
a plurality of base plates mechanically coupled to the top surface of the platform, wherein each base plate is disposed over at least a portion of one of the openings extending through the platform;
a plurality of beam emitters, each beam emitter being disposed over and coupled to one of the base plates; and
a cooling manifold coupled beneath the bottom surface of the platform, the cooling manifold defining a plurality of protrusions, wherein each protrusion extends upward into one of the openings in the platform to thereby define a fluid path extending from the cooling manifold, through the protrusion, and into the base plate disposed thereover.

2. The laser resonator of claim 1, further comprising one or more seals disposed between the cooling manifold and the bottom surface of the platform.

3. The laser resonator of claim 2, wherein each seal comprises an o-ring or a gasket.

4. The laser resonator of claim 1, further comprising a plurality of seals each disposed between one of the protrusions and one of the base plates.

5. The laser resonator of claim 4, wherein each seal comprises an o-ring or a gasket.

6. The laser resonator of claim 1, wherein the cooling manifold comprises a flexible and/or non-metallic material.

7. The laser resonator of claim 1, wherein the cooling manifold comprises a plastic material.

8. The laser resonator of claim 7, wherein the plastic material contains a non-plastic filler material.

9. The laser resonator of claim 8, wherein the filler material comprises glass.

10. The laser resonator of claim 1, wherein the cooling manifold comprises at least one of polyetherimide or polyetheretherketone.

11. The laser resonator of claim 1, further comprising:
a manifold fluid inlet;
a manifold fluid outlet; and
a feeder manifold (i) extending through and mechanically coupled to the resonator housing and (ii) fluidly connecting the manifold fluid inlet and manifold fluid outlet with the cooling manifold.

12. The laser resonator of claim 11, further comprising a seal between the feeder manifold and the cooling manifold.

13. The laser resonator of claim 12, wherein the seal comprises an o-ring or a gasket.

14. The laser resonator of claim 11, wherein the feeder manifold and the cooling manifold comprise different materials.

15. The laser resonator of claim 1, wherein the resonator housing comprises a metallic material.

16. The laser resonator of claim 15, wherein the resonator housing comprises aluminum.

17. The laser resonator of claim 1, wherein:
the cooling manifold comprises a first material;
the resonator housing comprises a second material; and
a thermal conductivity of the second material is greater than a thermal conductivity of the first material.

18. The laser resonator of claim 1, wherein each beam emitter comprises:
a laser diode or diode bar; and
an active cooler disposed beneath the laser diode or diode bar and above one of the base plates, the active cooler being fluidly connected to the fluid path extending into the base plate therebelow.

19. The laser resonator of claim 18, wherein the active cooler comprises an impingement cooler or a microchannel cooler.

20. The laser resonator of claim 1, wherein each of the openings extending through the platform is only partially covered by a base plate.

21. The laser resonator of claim 1, wherein each base plate comprises a ceramic material.

22. The laser resonator of claim 1, wherein each base plate comprises alumina.

23. The laser resonator of claim 1, wherein:
each base plate comprises a first material;
the resonator housing comprises a second material; and
a thermal conductivity of the second material is greater than a thermal conductivity of the first material.

24. The laser resonator of claim 1, further comprising, disposed within the resonator housing, a plurality of optical elements configured to receive and/or manipulate beams emitted by the beam emitters.

25. The laser resonator of claim 24, further comprising, extending through the resonator housing, a conduit configured to contain therewithin a cooling fluid for cooling the plurality of optical elements, wherein the conduit is fluidly isolated from the cooling manifold.

26. The laser resonator of claim 24, wherein the plurality of optical elements comprises (i) a dispersive element for combining the beams emitted by the beam emitters into a multi-wavelength beam, and (ii) a partially reflective output coupler for receiving the multi-wavelength beam from the dispersive element, transmitting a first portion of the multi-wavelength beam out of the resonator housing as a resonator output beam, and reflecting a second portion of the multi-wavelength beam back toward the dispersive element.

27. The laser resonator of claim 26, wherein the dispersive element and the partially reflective output coupler are disposed over the bottom surface of the interior platform.

28. The laser resonator of claim 26, wherein the plurality of optical elements comprises:
a plurality of slow-axis collimation lenses disposed optically downstream of the plurality of beam emitters, each slow-axis collimation lens configured to receive one or more beams from one of the beam emitters; and
a plurality of folding mirrors disposed optically downstream of the slow-axis collimation lenses and positioned to receive beams therefrom.

29. The laser resonator of claim 28, wherein the plurality of slow-axis collimation lenses and the plurality of folding mirrors are disposed over the top surface of the interior platform.

* * * * *